United States Patent
Huang et al.

(10) Patent No.: US 7,768,015 B2
(45) Date of Patent: Aug. 3, 2010

(54) PIXEL STRUCTURE OF DISPLAY PANEL AND METHOD OF MAKING THE SAME

(75) Inventors: Te-Chun Huang, Hsin-Chu (TW); Kuo-Yu Huang, Hsin-Chu (TW); Hsiang-Lin Lin, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 28 days.

(21) Appl. No.: 12/269,027

(22) Filed: Nov. 11, 2008

(65) Prior Publication Data

US 2009/0289259 A1 Nov. 26, 2009

(30) Foreign Application Priority Data

May 23, 2008 (TW) ............................... 97119155 A

(51) Int. Cl.
*H01L 21/14* (2006.01)
(52) U.S. Cl. .......... 257/72; 257/E33.053; 257/E21.131; 438/158
(58) Field of Classification Search .................. 257/59, 257/57, 88, 642, 72, E33.053, E21.414, E21.131, 257/E21.132; 349/114, 123, 38, 39, 43, 44, 349/139; 438/26, 29, 30, 625, 653, 158
See application file for complete search history.

(56) References Cited

U.S. PATENT DOCUMENTS

| | | | |
|---|---|---|---|
| 2004/0259359 A1* | 12/2004 | Chang et al. | ................. 438/689 |
| 2006/0119753 A1 | 6/2006 | Luo | |
| 2007/0108899 A1* | 5/2007 | Jung et al. | .................. 313/506 |

FOREIGN PATENT DOCUMENTS

| | | |
|---|---|---|
| CN | 1560687 | 1/2005 |
| JP | 09-162412 | 6/1997 |

* cited by examiner

*Primary Examiner*—Thomas L Dickey
*Assistant Examiner*—Nikolay Yushin
(74) *Attorney, Agent, or Firm*—Winston Hsu

(57) ABSTRACT

A pixel structure of a display panel is provided. The pixel structure includes a first storage capacitor formed by a pixel electrode and a common electrode pattern, and a second storage capacitor formed by an electrode pattern and the common electrode pattern. Accordingly, the storage capacitance is greatly improved without sacrificing the aperture ratio, or the aperture ratio is improved by reducing the area of the storage capacitor while the storage capacitance is maintained.

14 Claims, 24 Drawing Sheets

PIXEL STRUCTURE OF DISPLAY PANEL AND METHOD OF MAKING THE SAME

BACKGROUND OF THE INVENTION

1. Field of the Invention

The present invention relates to a pixel structure of a display panel and method of making the same, and more particularly, to a pixel structure including two storage capacitors composed of three layers of overlapping electrodes and method of making the same.

2. Description of the Prior Art

A pixel structure of a liquid crystal display (LCD) requires a storage capacitor, which can increase the storage capacitance so that electrical charges injected into the pixel electrode can be sustained until next scanning. Please refer to FIG. 1. FIG. 1 illustrates a conventional pixel structure of an LCD. As shown in FIG. 1, the pixel structure 10 includes a substrate 12; a thin film transistor (TFT) region 14 and a pixel region 16 defined on the substrate 12. The TFT region 14 includes a TFT, which includes a gate electrode 18, a gate insulating layer 20, a semiconductor layer 22, a heavily doped semiconductor layer 24, a source electrode 26, and a drain electrode 28. The pixel region 16 includes a common electrode 30, a dielectric layer 32, and a pixel electrode 34. The pixel electrode 34 and the drain electrode 28 are electrically connected together, the drain electrode 28 and the common electrode 30 partially overlap, and the overlapping part of the drain electrode 28 and the common electrode 30 forms a storage capacitor Cst.

The storage capacitor Cst of the conventional pixel structure 10 is formed by the overlapping part of two conductive layers including the drain electrode 28 and the common electrode 30. To increase the capacitance, the overlapping area of the drain electrode 28 and the common electrode 30 must increase, and this, however, would reduce the aperture ratio and influence display effect.

SUMMARY OF THE INVENTION

It is therefore one of the objectives of the present invention to provide a pixel structure of a display panel and method of making the same to improve the storage capacitance.

According to the present invention, a pixel structure of a display panel is provided. The pixel structure includes a substrate, a first conductive-patterned layer disposed on the substrate, a first insulating layer disposed on the first conductive-patterned layer and the substrate, a semiconductor layer, a second conductive-patterned layer disposed on the semiconductor layer and the first insulating layer, a second insulating layer, and a pixel electrode disposed on the second insulating layer. The first conductive-patterned layer includes a gate electrode, an electrode pattern, and two first common electrode patterns disconnected to each other. The first insulating layer includes at least two first openings respectively partially exposing the first common electrode patterns. The semiconductor layer is disposed on the first insulating layer and corresponding to the gate electrode. The second conductive-patterned layer includes a source electrode, a drain electrode, a data line, and a second common electrode pattern. The source electrode and the drain electrode are disposed on the semiconductor layer and respectively correspond to two opposite sides of the gate electrode. The data line is disposed on the first insulating layer and electrically connected to the source electrode. The second common electrode pattern is disposed on the first insulating layer, and the second common electrode pattern partially overlaps with the electrode pattern, and is electrically connected to the two first common electrode patterns respectively via the two first openings of the first insulating layer. The second insulating layer is disposed on the first insulating layer and the second conductive-patterned layer. The pixel electrode, the drain electrode and the electrode pattern are electrically connected together. The pixel electrode and the second common electrode pattern partially overlap so that the pixel electrode and the second common electrode pattern form a first storage capacitor, and the electrode pattern and the second common electrode pattern partially overlap to form a second storage capacitor.

According to the present invention, a method of forming a pixel structure of a display panel is provided. The method includes the following steps. First, a substrate is provided, and a first conductive-patterned layer is formed on the substrate. The first conductive-patterned layer includes a gate electrode, an electrode pattern, and two first common electrode patterns disconnected to each other. Then, a first insulating layer is formed on the substrate and the first conductive-patterned layer, and a semiconductor layer is formed on the first insulating layer. The semiconductor layer is partially removed to form a channel corresponding to the gate electrode, and two first openings respectively partially exposing the first common electrode pattern are formed. Subsequently, a second conductive-patterned layer is formed on the semiconductor layer and the first insulating layer. The second conductive-patterned layer includes a source electrode and a drain electrode disposed on the semiconductor layer and respectively corresponding to two opposite sides of the gate electrode, a data line disposed on the first insulating layer and electrically connected to the source electrode, and a second common electrode pattern disposed on the first insulating layer. The second common electrode pattern partially overlaps with the electrode pattern, and is electrically connected to the two first common electrode patterns respectively via the two first openings of the first insulating layer. Following that, a second insulating layer is formed on the first insulating layer and the second conductive-patterned layer, and a pixel electrode is formed on the second insulating layer. The pixel electrode and the second common electrode pattern partially overlap so that the pixel electrode and the second common electrode pattern form a first storage capacitor, and the electrode pattern and the second common electrode pattern partially overlap to form a second storage capacitor.

The pixel structure of display panel of the present invention includes two storage capacitors formed by three layers of conductive layers. Consequently, the storage capacitance is significantly improved without sacrificing the aperture ratio, or the aperture ratio is improved by reducing the area of the storage capacitor while the storage capacitance is maintained.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
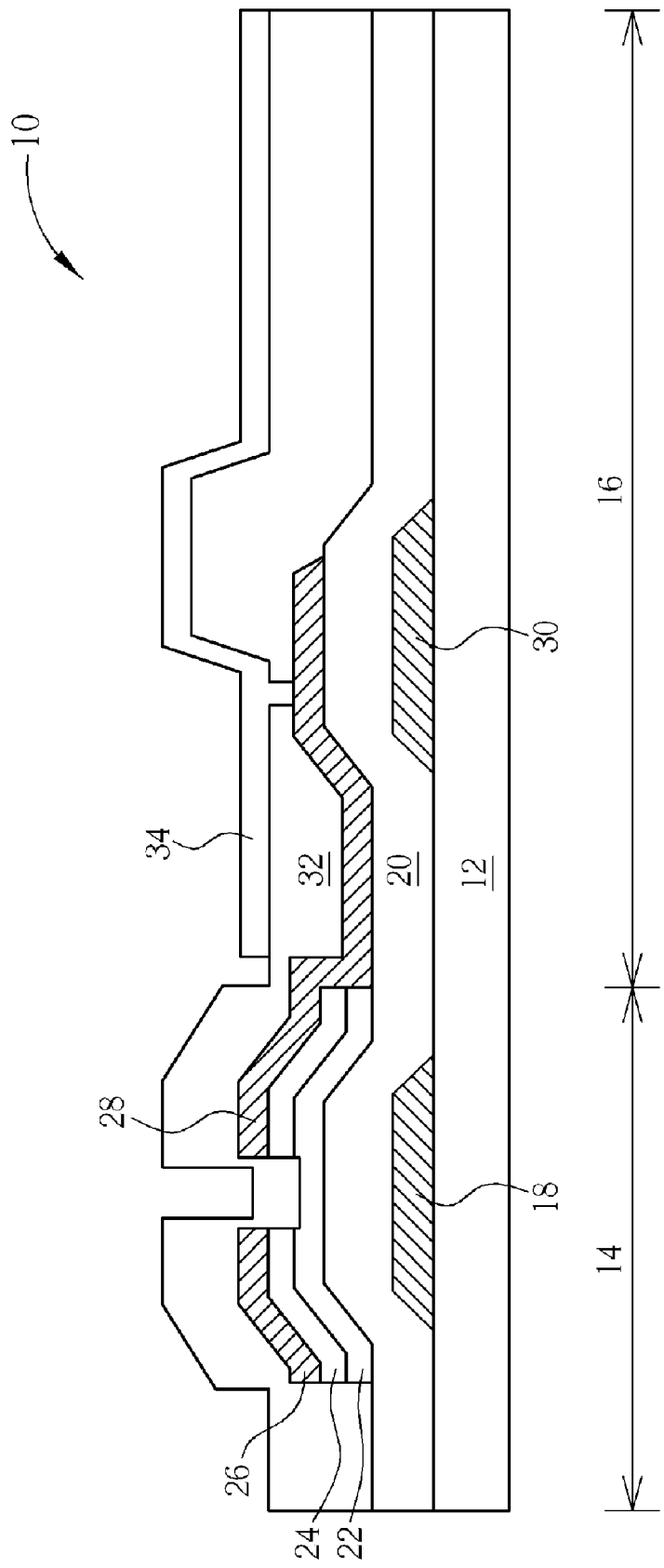
FIG. 1 illustrates a conventional pixel structure of an LCD.
Figure 2A:
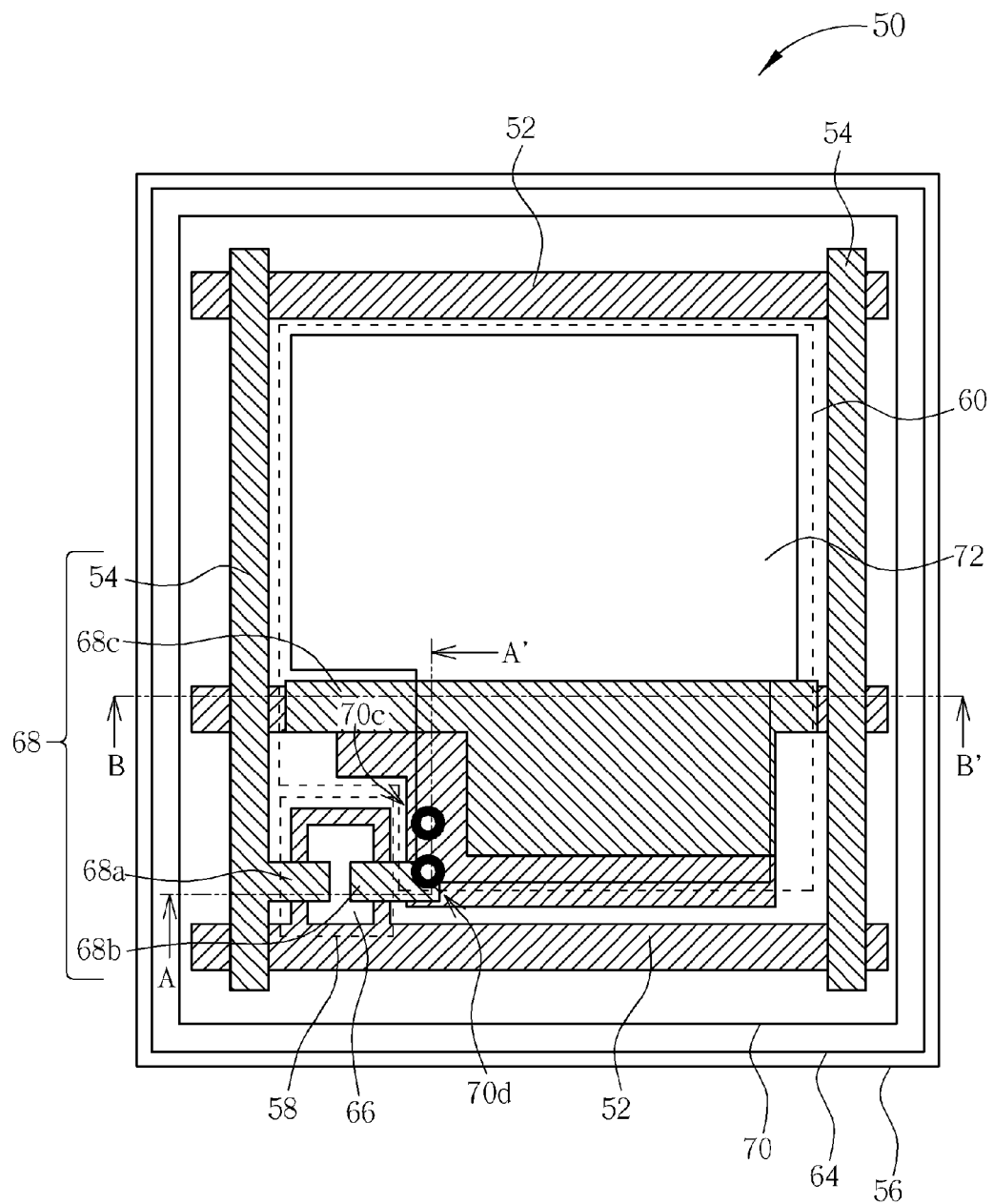
FIGS. 2-4 illustrate a pixel structure of a display according to a first preferred embodiment of the present invention.
Figure 2B:
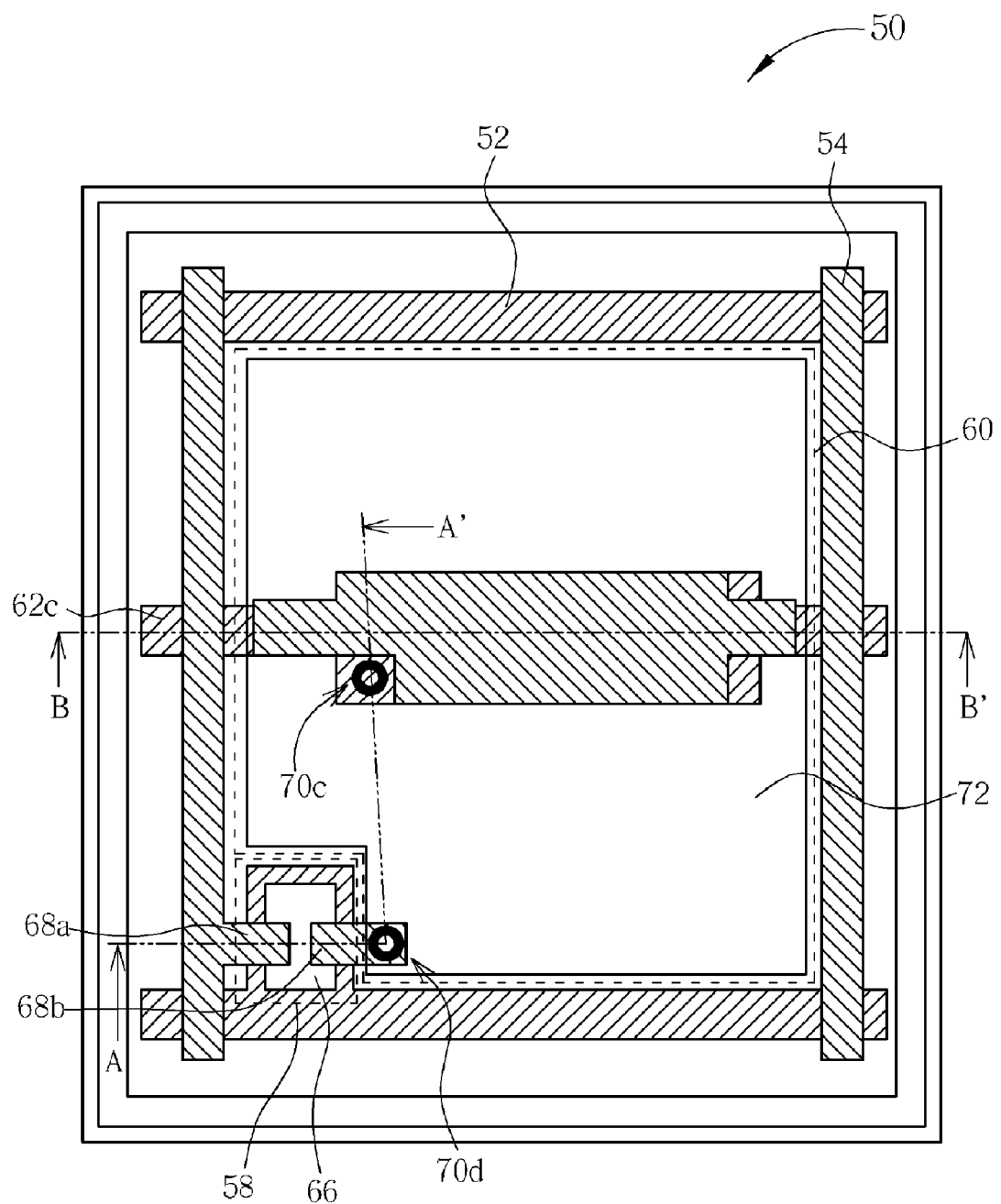
Figure 3:
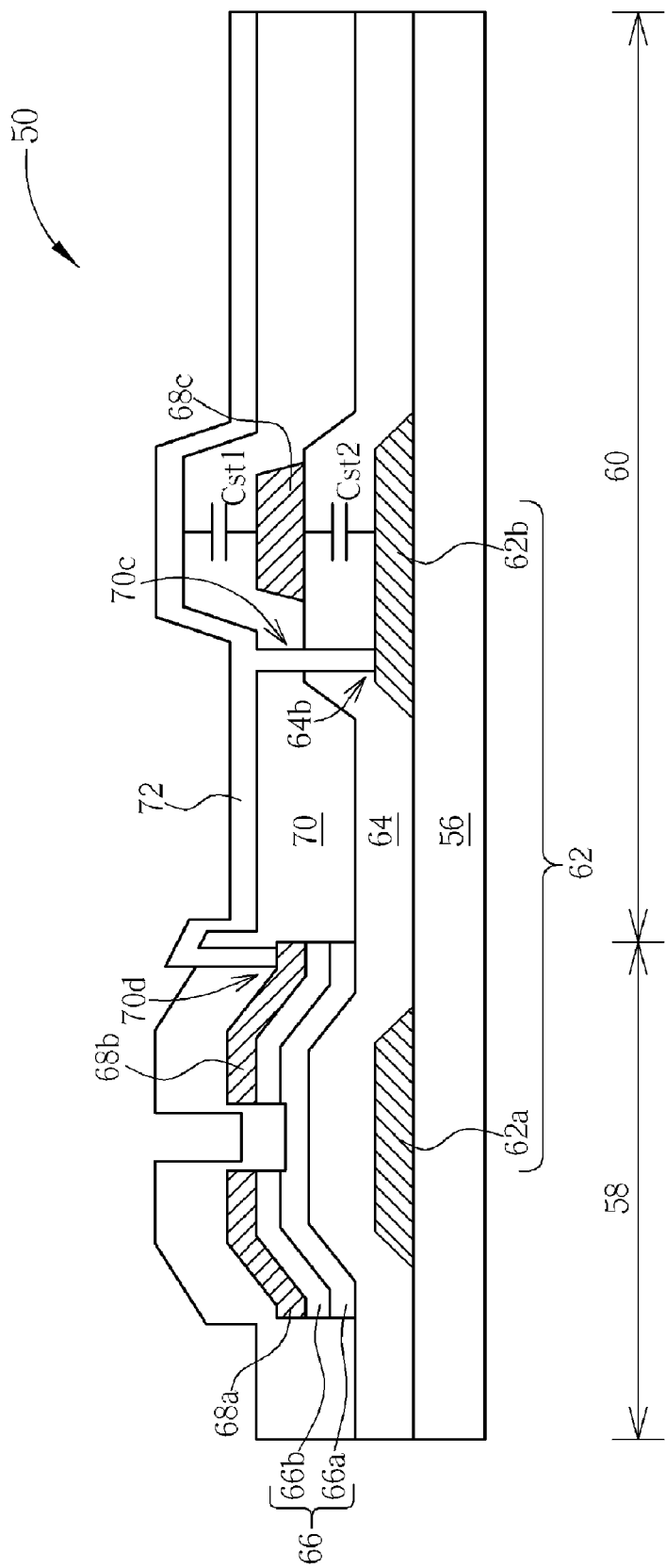
Figure 4:
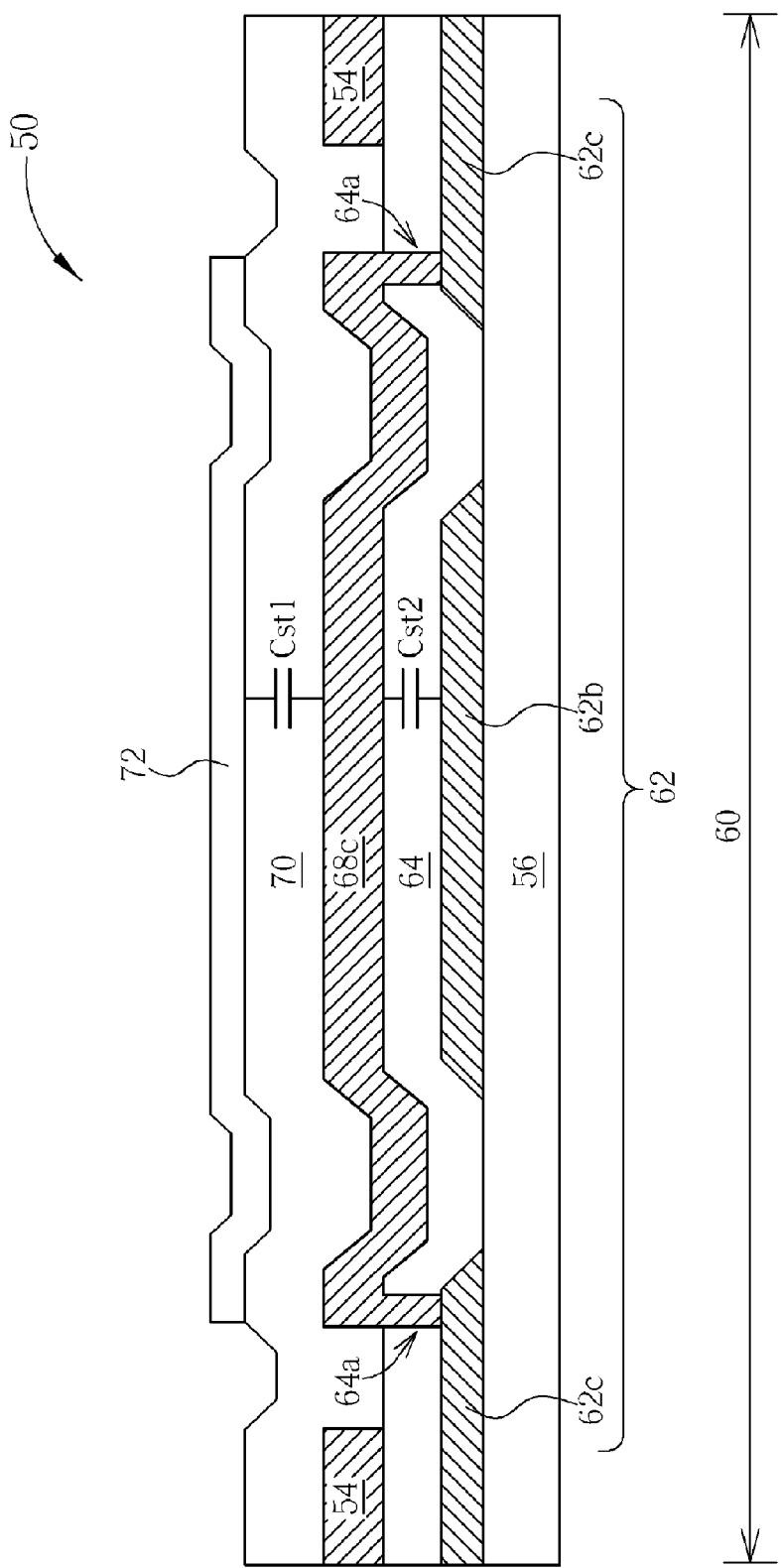

Please refer to FIGS. 2-4. FIGS. 2-4 illustrate a pixel structure of a display according to a first preferred embodiment of the present invention, where FIG. 2a and FIG. 2b are top views of two variations of the pixel structure in this embodiment, FIG. 3 is a cross-sectional view of the pixel structure of FIGS. 2a and 2b along the lines A-A', and FIG. 4 is a cross-sectional view of the pixel structure of FIGS. 2a and 2b along the lines B-B'. In the embodiments of the present invention, the pixel structure of an LCD panel is selected as examples to illustrate the application of the present invention, the pixel structure, however, may be used in various types of display panels. As shown in FIGS. 2-4, the pixel structure 50 is defined by two scan lines 52 and two data lines 54. The two scan lines 52 are arranged in parallel, the two data lines 54 are arranged in parallel, and the scan lines 52 and data lines 54 are perpendicularly arranged. The pixel structure 50 is disposed on the substrate 56, and a TFT region 58 and a pixel region 60 (denoted by dotted line) are defined in the substrate 56. The pixel structure 50 includes a first conductive-patterned layer 62, a first insulating layer 64, a semiconductor layer 66, a second conductive-patterned layer 68, a second insulating layer 70, and a pixel electrode 72. The first conductive-patterned layer 62 is disposed on the substrate; the first insulating layer 64 is disposed on the first conductive-patterned layer 62 and the substrate 56; the semiconductor layer 66 is disposed on the first insulating layer 64; and the second conductive-patterned layer 68 is disposed on the semiconductor layer 66 and the first insulating layer 64.

The first conductive-patterned layer 62 includes a gate electrode 62a, an electrode pattern 62b, two first common electrode patterns 62c disconnected to each other, and a scan line 52, where the gate electrode 62a is disposed in the TFT region 58, and the electrode pattern 62b and the first common electrode patterns 62c are disposed in the pixel region 60. The first insulating layer 64 includes two first openings 64a respectively exposing part of the first common electrode patterns 62c. The semiconductor layer 66, for instance an amorphous silicon layer is disposed in the TFT region 58 and corresponding to the gate electrode 62a. The semiconductor layer 66 includes a semiconductor channel 66a used as a channel, and a heavily doped semiconductor layer 66b disposed on the semiconductor channel 66a and used as an ohmic contact layer. The second conductive-patterned layer 68 includes a source electrode 68a, a drain electrode 68b, a data line 54, and a second common electrode pattern 68c. The source electrode 68a and the drain electrode 68b are disposed on the semiconductor layer 66 and respectively corresponding to two opposite sides of the gate electrode 62a; the data line 54 is disposed on the first insulating layer 64 and electrically connected to the source electrode 68a. The second common electrode pattern 68c is disposed on the first insulating layer 64 and partially overlaps with the electrode pattern 62b.

Two opposite sides of the second common electrode pattern 68c respectively correspond to the two first openings 64a of the first insulating layer 64, such that the second common electrode pattern 68c is respectively electrically connected to the two first common electrode patterns 62c. The second insulating layer 70 is disposed on the first insulating layer 64 and the second conductive-patterned layer 68. The pixel electrode 72, which is disposed on the second insulating layer 70, the drain electrode 68b and the electrode pattern 62b are electrically connected together. The pixel electrode 72 and the second common electrode pattern 68c overlap partially, such that the pixel electrode 72 and the second common electrode pattern 68c form a first storage capacitor Cst1, and the electrode pattern 62b and the second common electrode pattern 68c form a second storage capacitor Cst2.

The pixel electrode 72, the drain electrode 68b and the electrode pattern 62b are electrically connected. In this embodiment, the first insulating layer 64 further includes a second opening 64b partially exposing the electrode pattern 62b, and the second insulating layer 70 further includes a third opening 70c corresponding to the second opening 64b so that the pixel electrode 72 is electrically connected to the electrode pattern 62b via the third opening 70c and the second opening 64b. In addition, the second insulating layer 70 may includes a fourth opening 70d exposing the drain electrode 68b, such that the pixel electrode 72 is electrically connected to the drain electrode 68b via the fourth opening 70d. Accordingly, the pixel electrode 72, the drain electrode 68b, and the pattern electrode 62b are electrically connected together.

The pixel electrode 72 and the electrode pattern 62b of the pixel structure 50 have the same potential. The pixel electrode 72 and the second common electrode pattern 68c form the first storage capacitor Cst1, and the pattern electrode 62b and the second common electrode pattern 68c form the second storage capacitor Cst2. Consequently, the storage capacitance of the pixel structure 50 may be increased without sacrificing the aperture ratio, or the aperture ratio may be improved by reducing the area of the storage capacitor when the storage capacitance is maintained. In this embodiment, the electrode pattern 62b and the second common electrode pattern 68c are located in the pixel region 60 adjacent to the TFT region 58 as shown in FIG. 2, but the design of the pixel structure 50 is not limited and may be modified as the following variations.

Figure 5A:
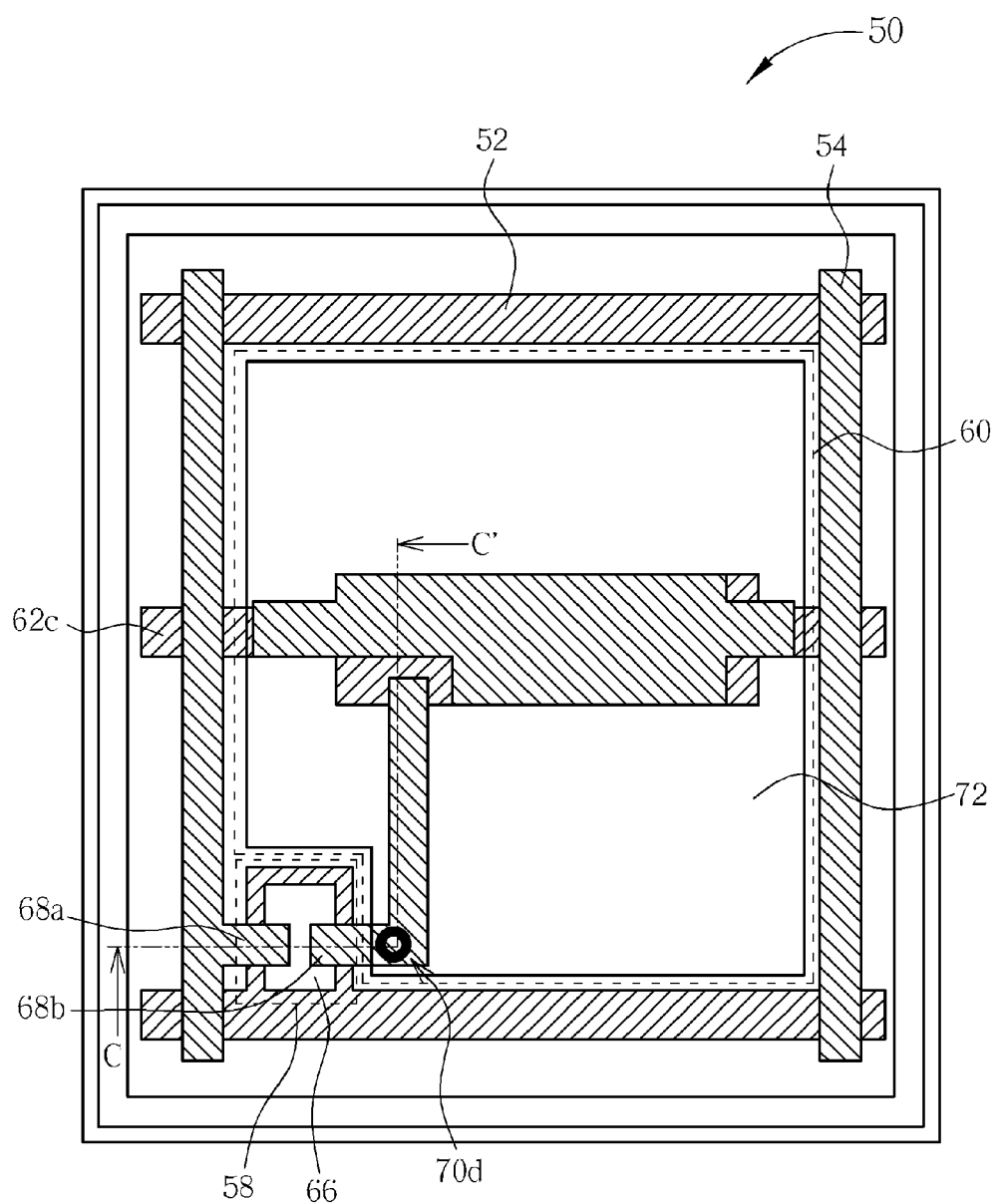
FIGS. 5a and 5b are top views illustrating a pixel structure of an LCD panel according to two variations of a second embodiment of the present invention.
Figure 5B:
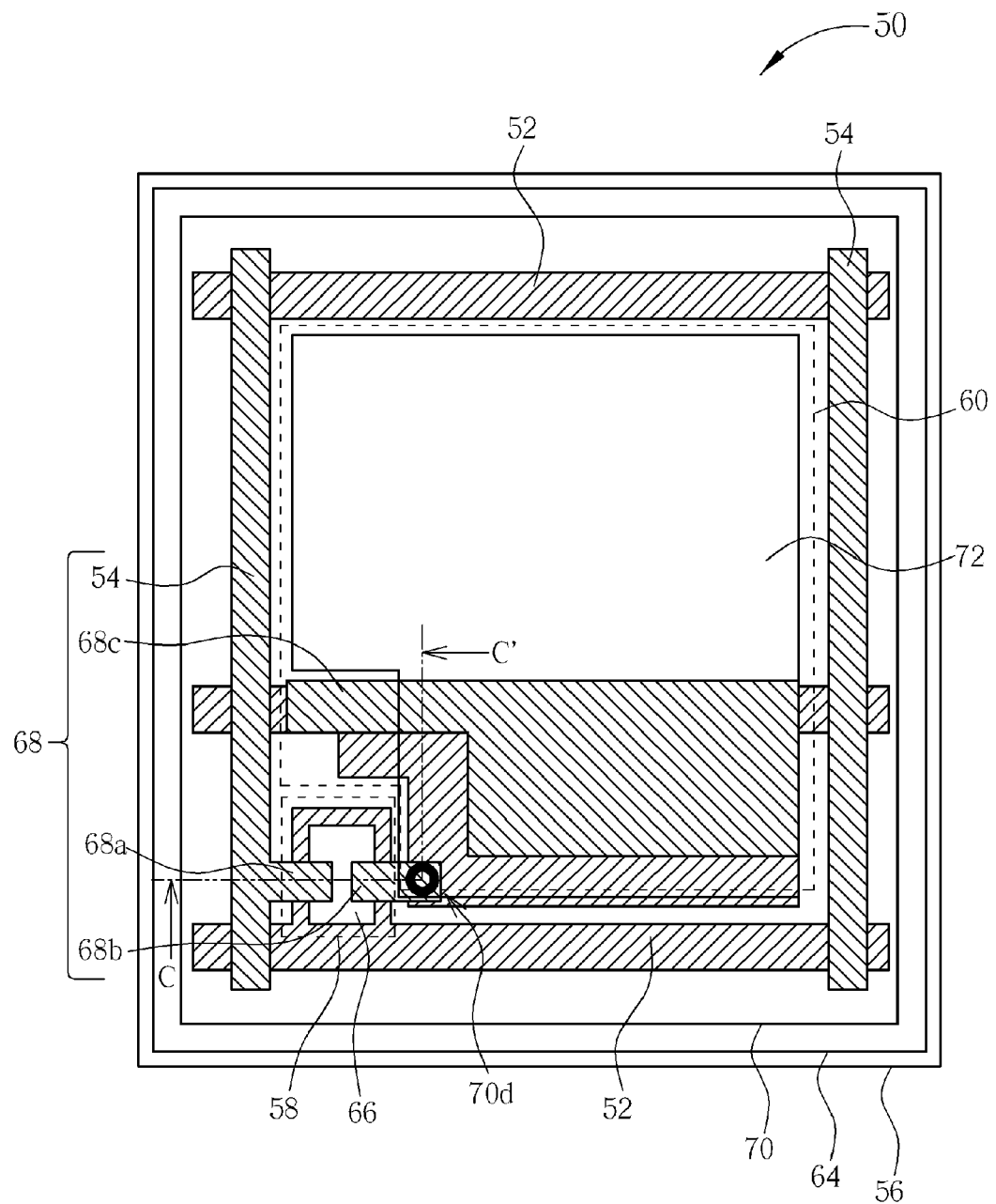
Figure 6:
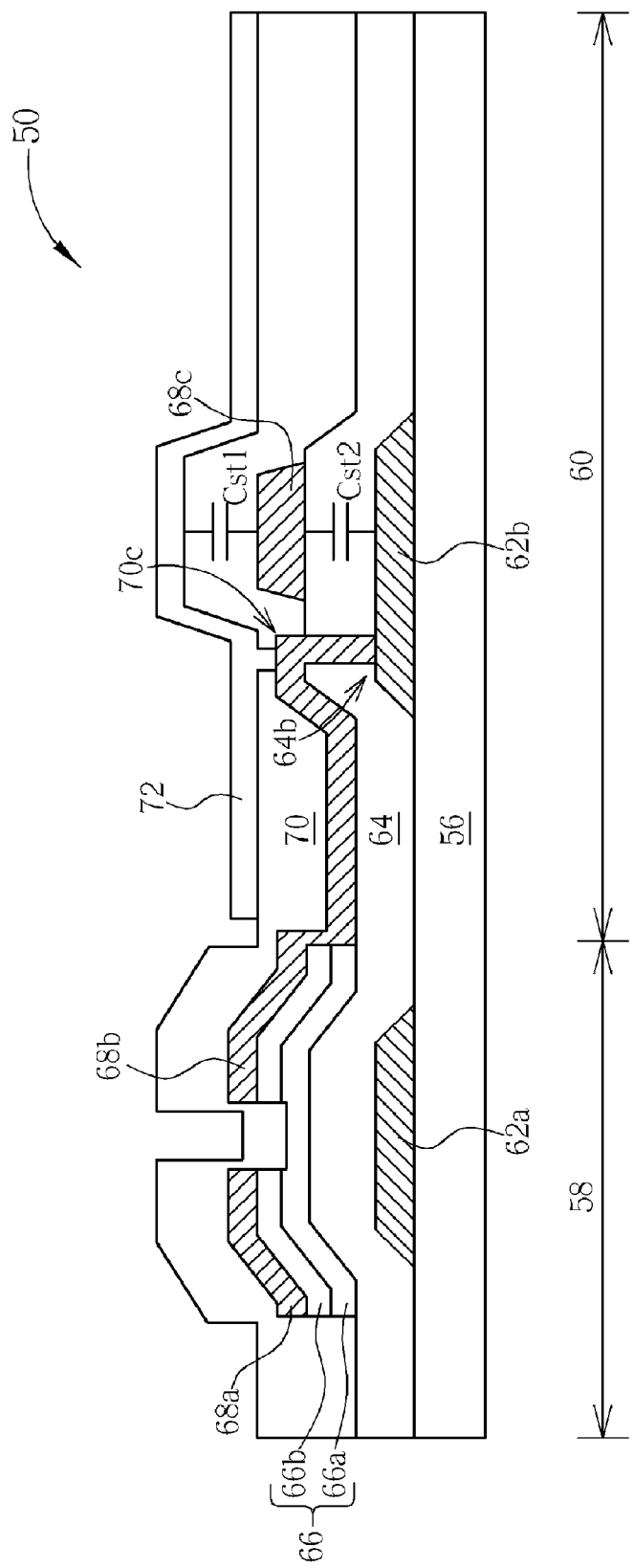
FIG. 6 is a cross-sectional view of the pixel structure of FIGS. 5a and 5b according to the second embodiment.

Please refer to FIGS. 5 and 6. FIGS. 5a and 5b are top views illustrating a pixel structure of an LCD panel according to two variations of a second embodiment of the present invention, where FIG. 6 is a cross-sectional view of the pixel structure of FIGS. 5a and 5b along a line C-C'. To compare the difference between different embodiments, identical components are denoted by identical numerals, and are not redundantly repeated. In the aforementioned embodiment, the electrode pattern 62b is electrically connected to the drain electrode 68b via the pixel electrode 72. In this embodiment, the electrode pattern 62b is directly electrically connected to the drain electrode 68b via the second opening 64b, instead of to the pixel electrode 72. The locations of the electrode pattern 62b and the second common electrode pattern 68c are different in these two variations of this embodiment. The electrode pattern 62b and the second common electrode pattern 68c are disposed in the central region of the pixel region 60 as shown in FIG. 5a; the electrode pattern 62b and the second common electrode pattern 68c are disposed in the pixel region 60 adjacent to the TFT region 58 as shown in FIG. 5b.

As shown in FIG. 6, the pixel electrode 72, the drain electrode 68b and the electrode pattern 62b are electrically connected in different manners between this embodiment and the aforementioned embodiment. In this embodiment, the first insulating layer 64 includes a second opening 64b partially exposing the electrode pattern 62b so that the drain electrode 68b is extended from the TFT region 58 to the pixel region 60, and electrically connected to the electrode pattern 62b via the second opening 64b. The second insulating layer 70 includes a third opening 70c partially exposing the drain electrode 68b, such that the pixel electrode 72 is electrically connected to the drain electrode 68b via the third opening 70c. In this embodiment, the pixel electrode 72 can be electrically connected to the drain electrode 68b through the third opening 70c, and thus a fourth opening is no longer required. Also, the third opening 70c and the second opening 64b are substantially corresponsive, but not limited. The locations of the third opening 70c and the second opening 64b may be modified, and are not necessary overlapping. By virtue of the above connection, the pixel electrode 72 and the electrode pattern 62b have the same potential. The pixel electrode 72 and the second common electrode pattern 68c form a first storage capacitor Cst1, and the electrode pattern 62b and the second common electrode pattern 68c form a second storage capacitor Cst2. Accordingly, the storage capacitance of the pixel structure 50 is improved.

Figure 7:
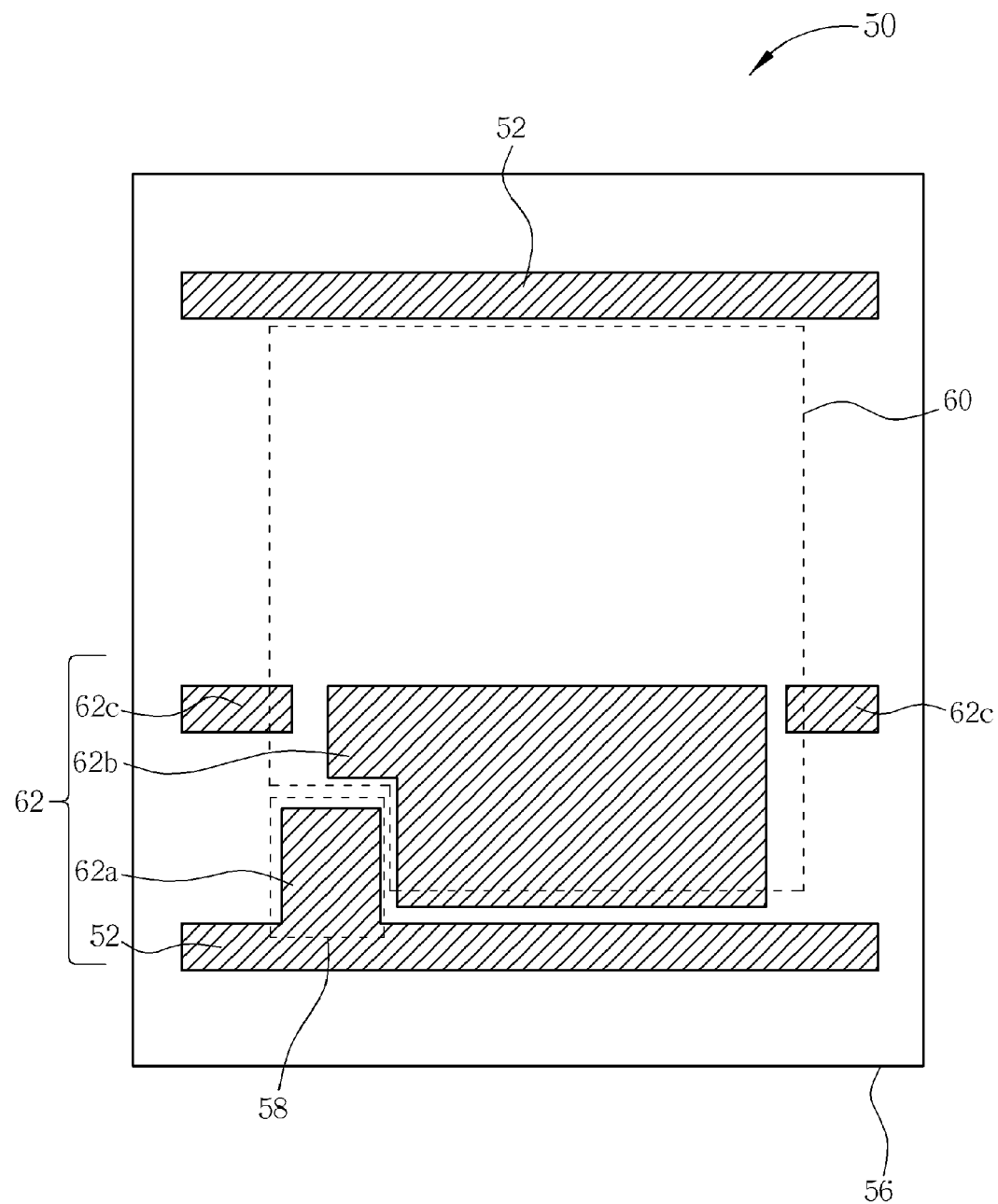
FIGS. 7-12 are schematic diagrams illustrating a method of forming a pixel structure of the present invention according to a preferred embodiment of the present invention.

Please refer to FIGS. 7-12. FIGS. 7-12 are schematic diagrams illustrating a method of forming a pixel structure of the present invention according to a preferred embodiment of the present invention, where some components are not shown in FIG. 7, which is a top view, and refer to FIG. 3-4 as well. As shown in FIG. 7, a substrate 56, such as a glass substrate or a flexible substrate, is provided. A conductive layer (not shown) e.g. a metal layer is formed on the substrate 56, and a first photolithography-and-etching process (PEP) is performed to pattern the conductive layer to form a first conductive-patterned layer 62 on the substrate 56. The first conductive-patterned layer 62 includes a gate electrode 62a, an electrode pattern 62b, two first common electrode patterns 62c disconnected to each other, and a scan line 52, where the gate electrode 62a is connected to the scan line 52.

Figure 8:
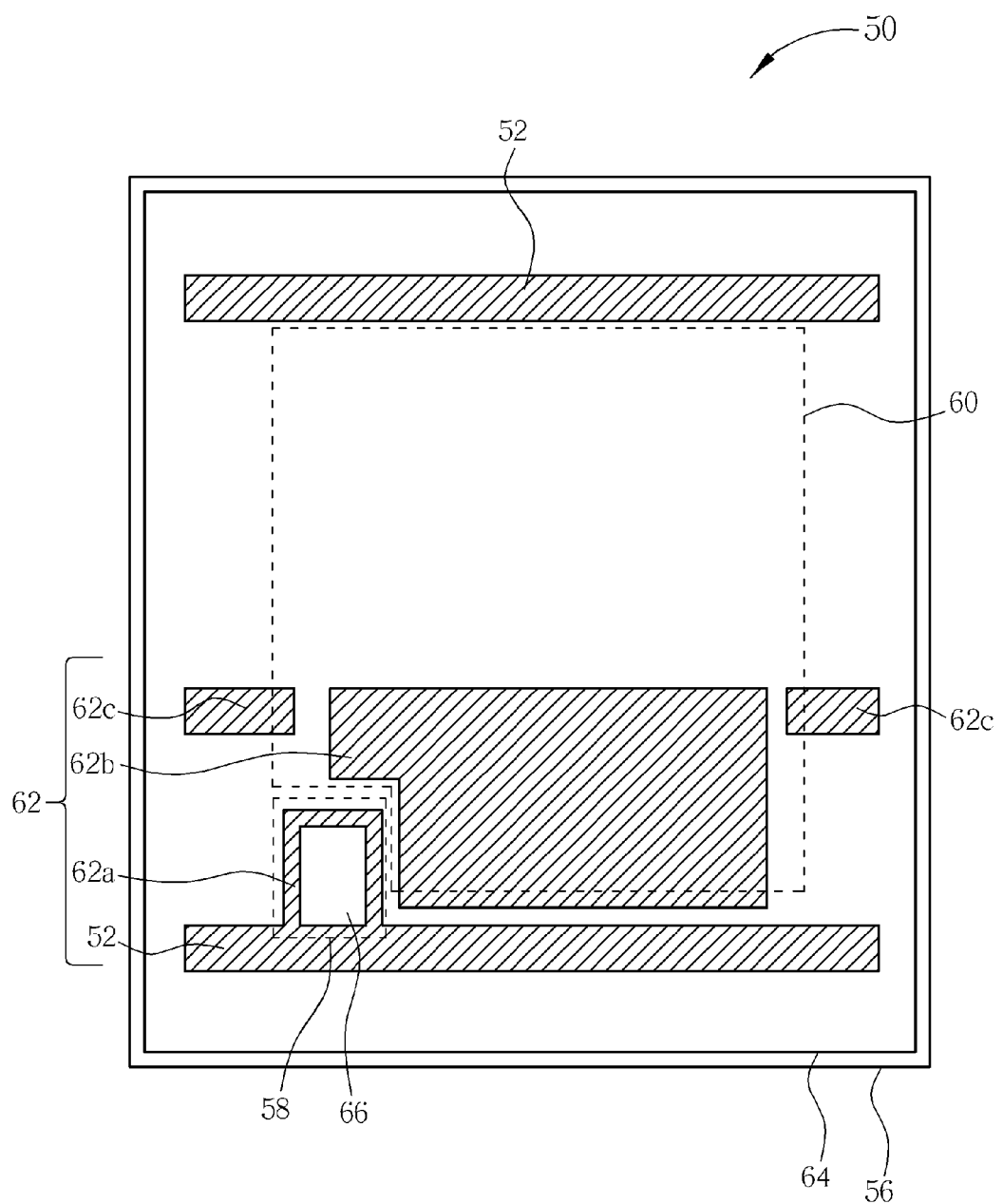

As shown in FIG. 8, a first insulating layer 64 is formed on the first conductive-patterned layer 62 and the substrate 56, and a semiconductor layer 66 is formed on the first insulating layer 64. The semiconductor layer 66 includes a semiconductor channel 66a used as a channel, and a heavily doped semiconductor layer 66b disposed on the semiconductor channel 66a and used as an ohmic contact layer. Subsequently, a second PEP is performed to partially remove the semiconductor layer 66 (including the semiconductor channel 66a and the heavily doped semiconductor layer 66b), while the semiconductor layer 66 corresponding to the gate electrode 62a (including the semiconductor channel 66a and the heavily doped semiconductor layer 66b) is reserved.

Figure 9:
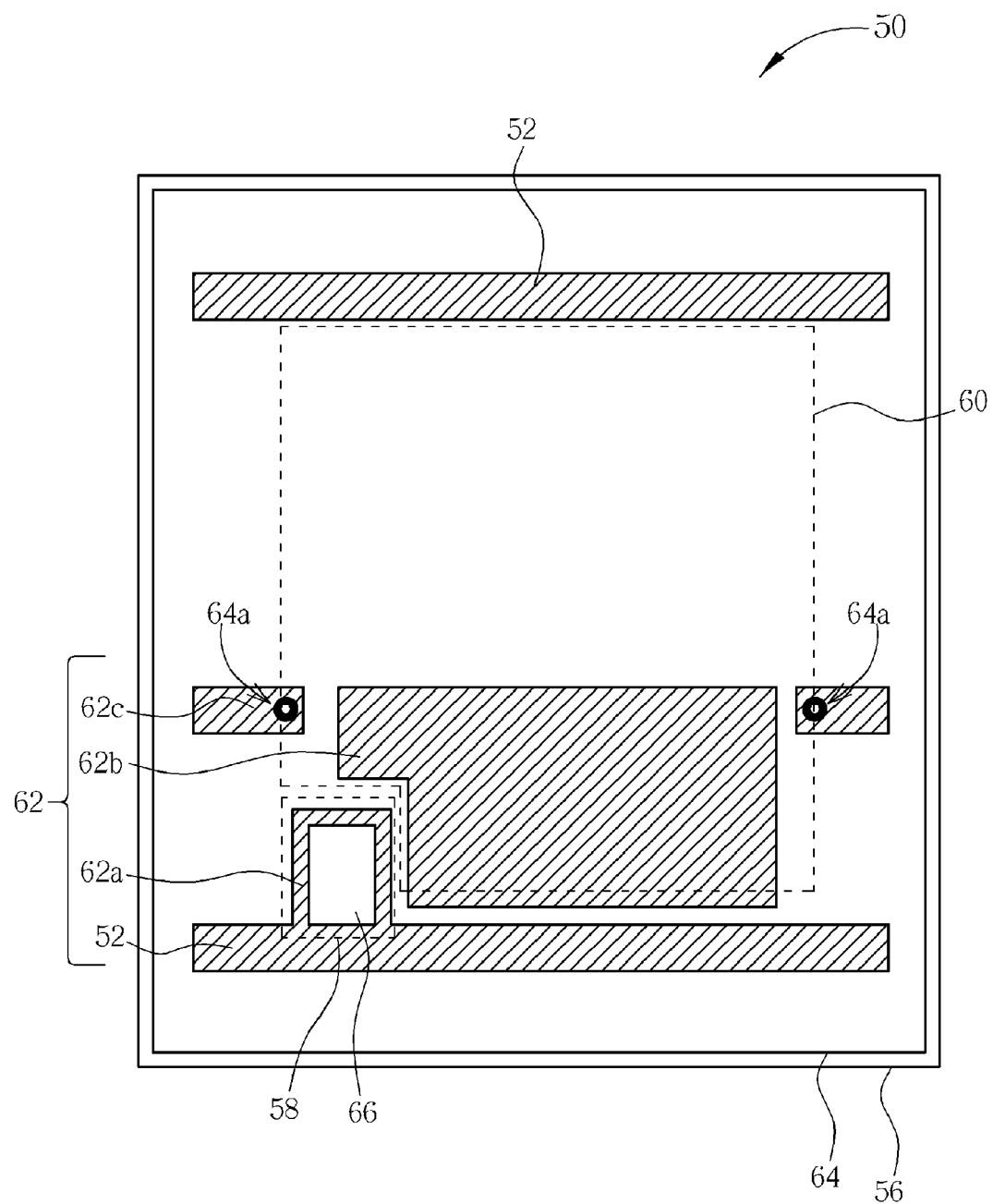

As shown in FIG. 9, a third PEP is carried out to form two first openings 64a respectively partially exposing the first common electrode patterns 62c disposed adjacent to two opposite sides of the electrode pattern 62b.

Figure 10:
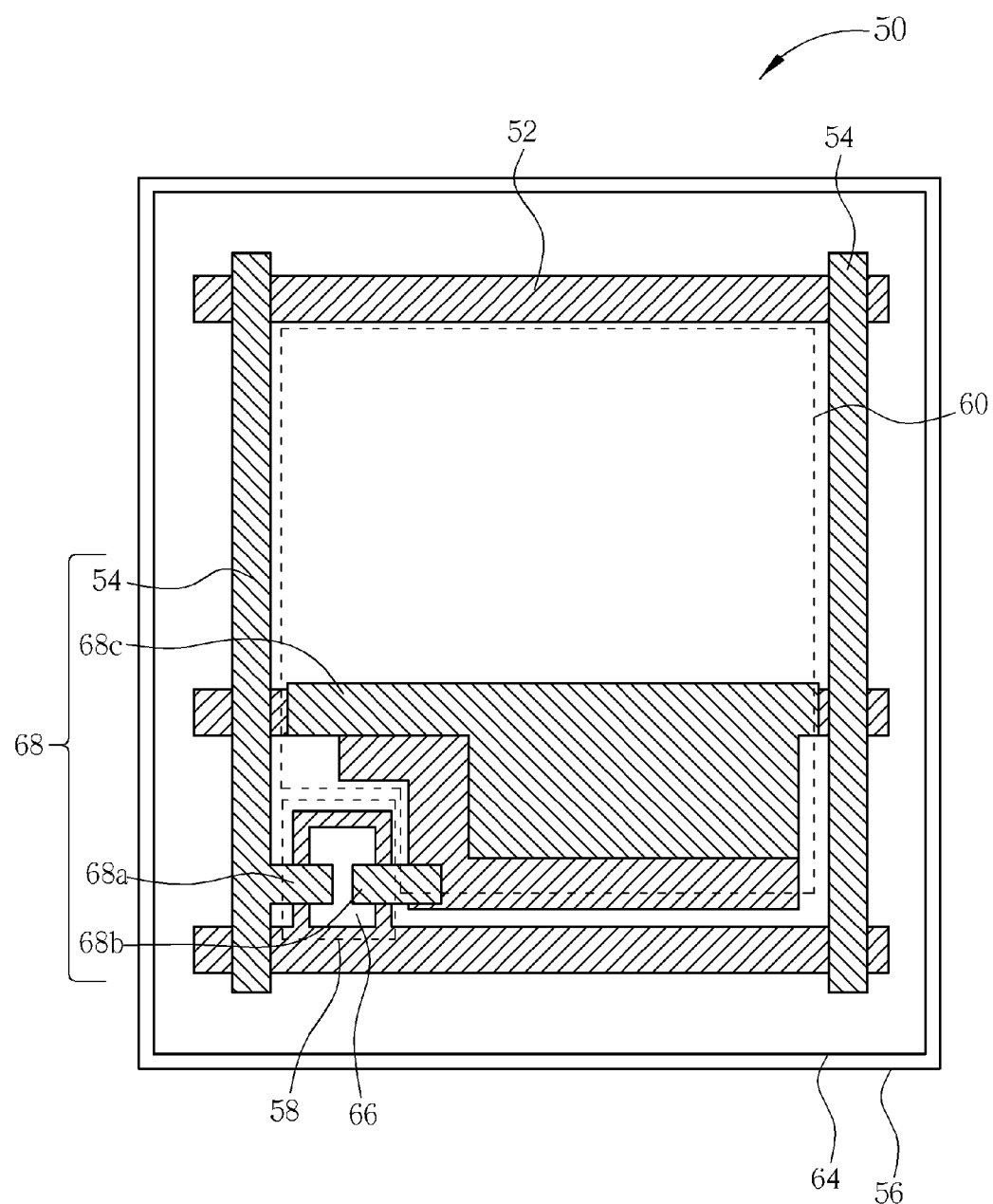

As shown in FIG. 10, another conductive layer (not shown) is formed on the semiconductor layer 66 and the first insulating layer 64, and a fourth PEP is implemented to partially remove the conductive layer to form a second conductive-patterned layer 68. The second conductive-patterned layer 68 includes a source electrode 68a and a drain electrode 68b disposed on the semiconductor layer 66 and corresponding to two opposite sides of the gate electrode 62a, a data line 54 disposed on the first insulating layer 64 and electrically connected to the source electrode 68a, and a second common electrode pattern 68c disposed on the first insulating layer 64. The second common electrode pattern 68c partially overlaps with the electrode pattern 62b, and respectively electrically connected to the two first common electrode pattern 62c via the two first openings 64a.

Figure 11:
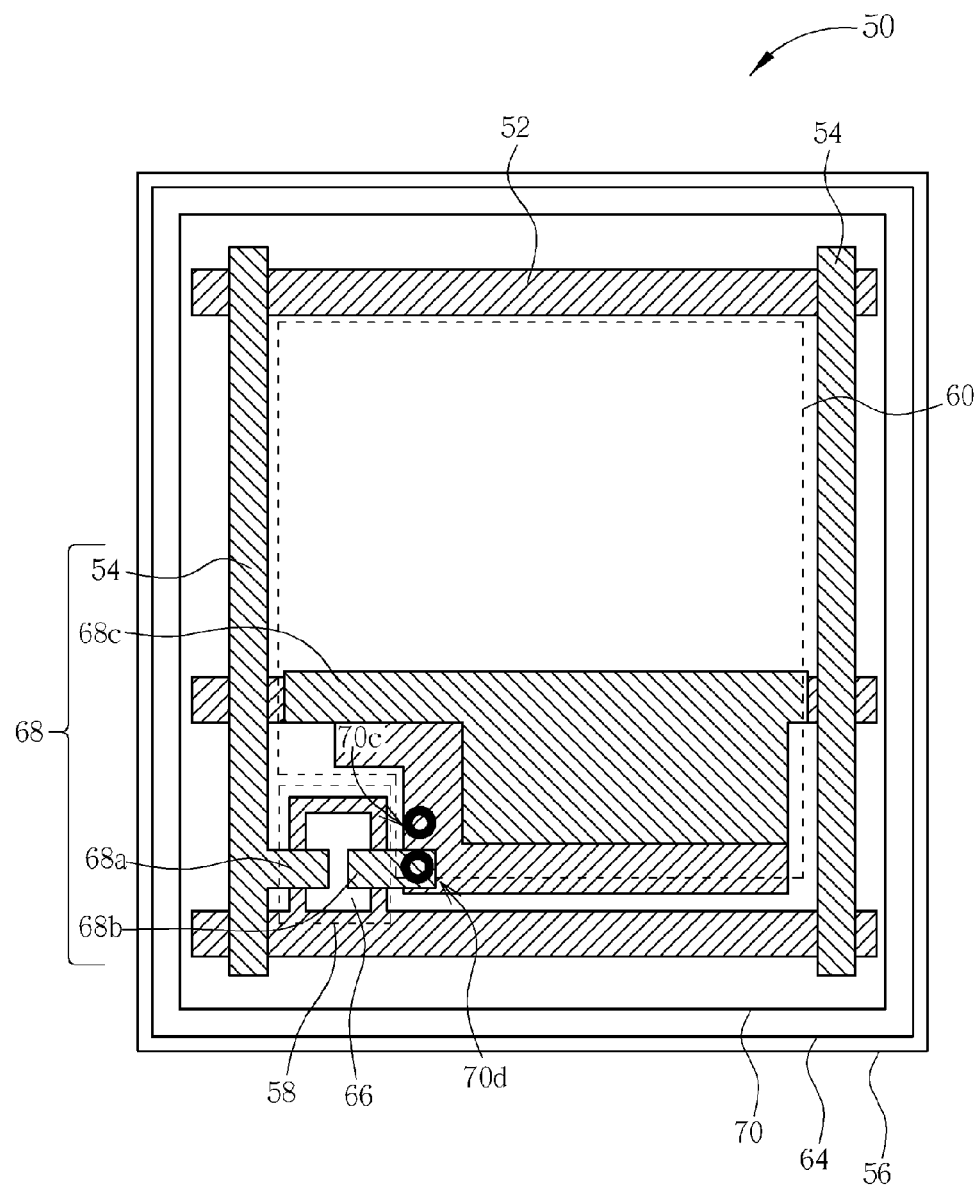

As shown in FIG. 11, a second insulating layer 70 is formed on the first insulating layer 64 and the second conductive-patterned layer 68, and a fifth PEP is implemented to partially remove the second insulating layer 70 to form a third opening 70c and a fourth opening 70d in the second insulating layer 70, where the fourth opening 70d corresponds to the drain electrode 68b. Subsequently, the first insulating layer 64 is etched through the third opening 70c to form a second opening 64b corresponding to the third opening 70c in the first insulating layer 64.

Figure 12:
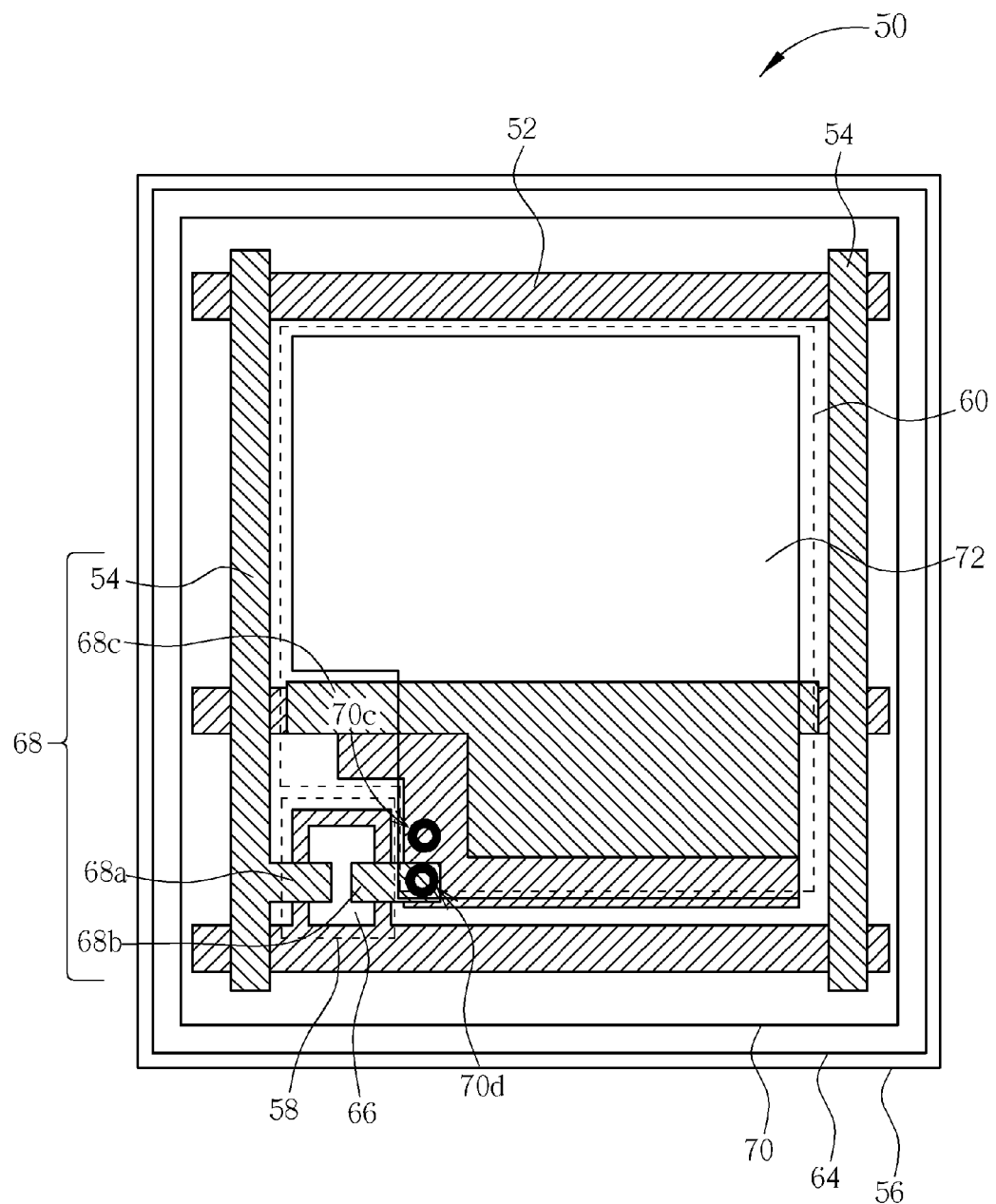

As shown in FIG. 12, a pixel electrode 72 is formed on the second insulating layer 70, filled into the third opening 70c and the second opening 64b and electrically connected to the electrode pattern 62b, and also filled into the fourth opening 70d and electrically connected to the drain electrode 68b. The pixel electrode 72 and the second common electrode pattern 68c partially overlap such that the pixel electrode 72 and the second common electrode pattern 68c form a first storage capacitor Cst1, and the electrode pattern 62b and the second common electrode pattern 68c form a second storage capacitor Cst2.

The method of the aforementioned embodiment can fabricate the pixel structure shown in FIGS. 2-4, and the pixel structure shown in FIGS. 5-6 may also be formed by similar steps. The method of forming the pixel structure shown in FIG. 5b is illustratively described. Please refer to FIG. 5b and FIG. 6, in conjunction with FIGS. 7-12. For instance, a second opening 64b (as shown in FIG. 6) may be formed in the first insulating layer 64 to expose the electrode pattern 62b simultaneously at the step of forming the first opening 64a in the first insulating layer 64. In the step of forming the drain electrode 68b of the second conductive-patterned layer 68 as shown in FIG. 10, the layout of the second conductive-patterned layer 68 may be redesigned such that the drain electrode 68b can be electrically connected to the electrode pattern 62b via the second opening 64b of the first insulating layer 64. In this embodiment, a third opening 70c is required to be formed in the second insulating layer 70, but a fourth opening is no longer required because the drain electrode 68b and electrode pattern 62b are already electrically connected. Accordingly, the pixel structure shown in FIG. 5b is formed.

The aforementioned embodiment uses six different photomasks to define the patterns of different material layers, and the patterns of the semiconductor layer 66 and the first opening 64a of the first insulating layer 64 are define by two different photomasks in the second and third PEPs respectively. The manufacturing method of the present invention, however, is not limited by the above embodiment. For instance, the sequence of defining the patterns of the semiconductor layer 66 and the first opening 64a of the first insulating layer 64 may be swapped. The method of the present invention may also be completed using five photomasks, and is described in the following embodiment.

Figure 13:
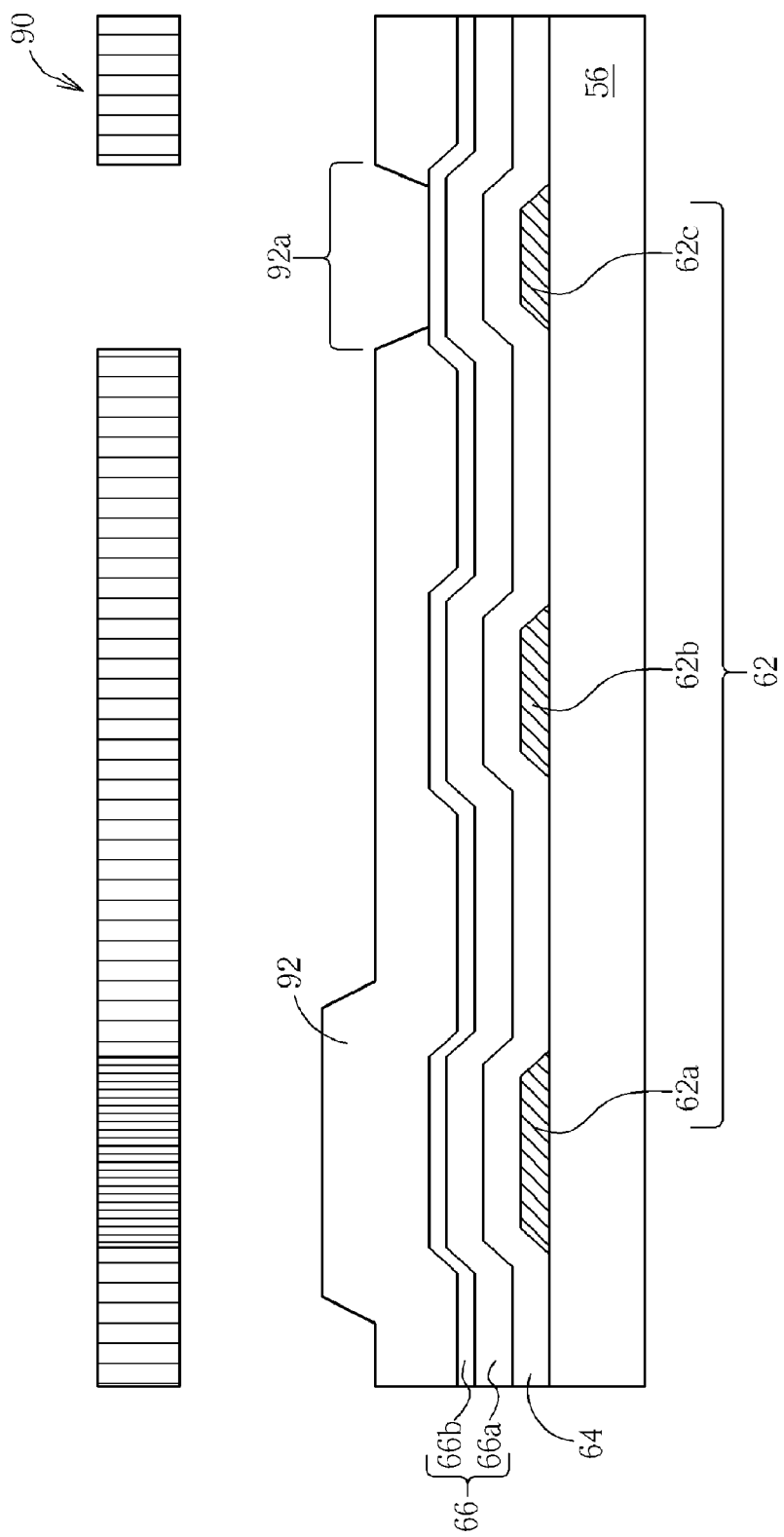
FIGS. 13-16 illustrate a method of forming a pixel structure of a display panel according to another embodiment of the present invention.

Please refer to FIGS. 13-16 in conjunction with FIG. 7 and FIGS. 10-12. FIGS. 13-16 illustrate a method of forming a pixel structure of a display panel according to another embodiment of the present invention. As shown in FIG. 13, a first conductive-patterned 62 is formed on a substrate 56, and a first insulating layer 64 and a semiconductor layer 66 are consecutively formed on the first conductive-patterned layer 62 and the substrate 56, where the semiconductor layer 66 includes a semiconductor channel 66a and a heavily doped semiconductor layer 66b. Then, a halftone photomask 90 is used to form a photoresist pattern 92 on the heavily doped semiconductor layer 66b, where the photoresist pattern 92 has an opening 92a corresponding to the first common electrode pattern 62c.

Figure 14:
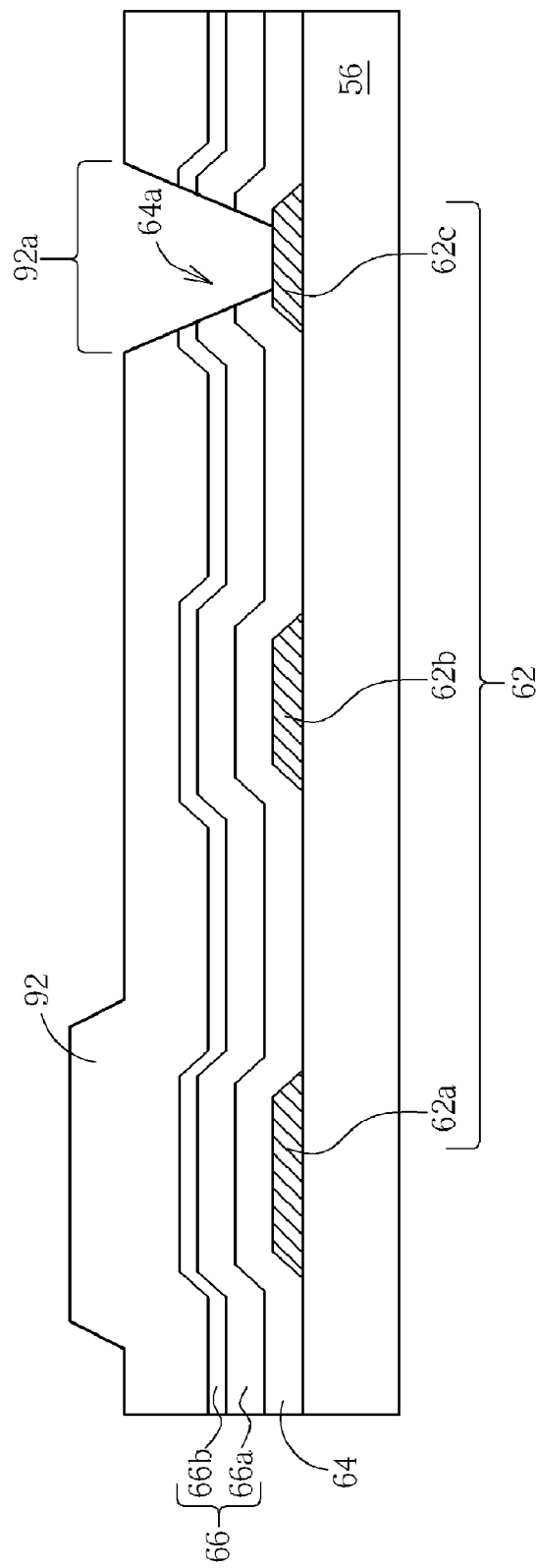

As shown in FIG. 14, an etching process is performed to etch the semiconductor layer 66 and the first insulating layer 64 exposed by the opening 92a of the photoresist pattern 92, and therefore a first opening 64a partially exposing the first common electrode pattern 62c is formed in the first insulating layer 64.

Figure 15:
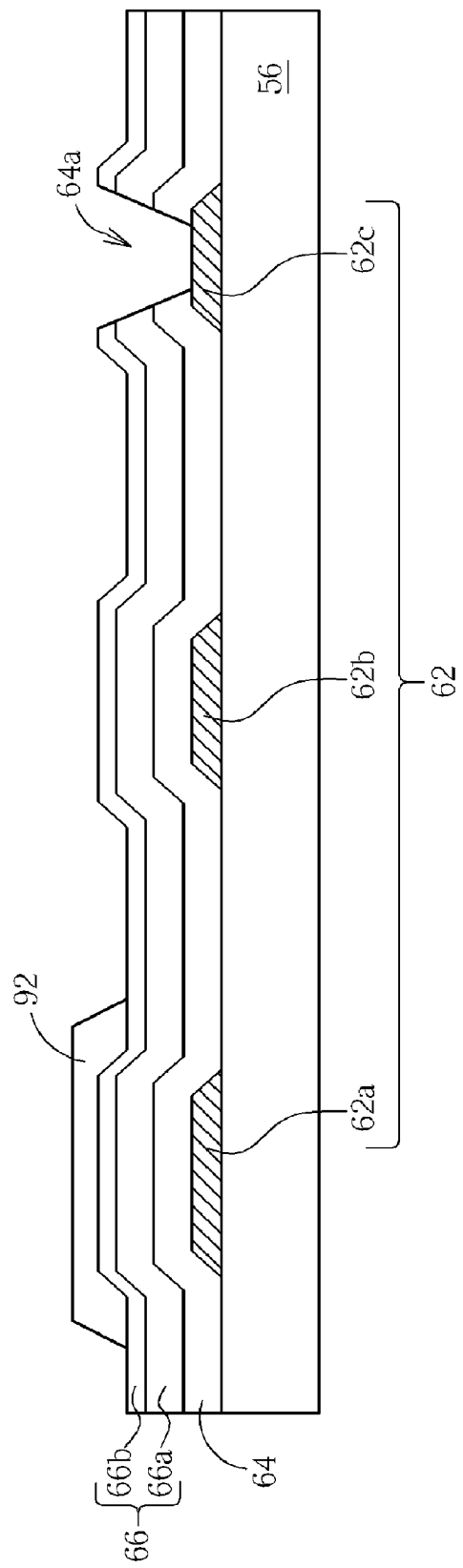
Figure 16:
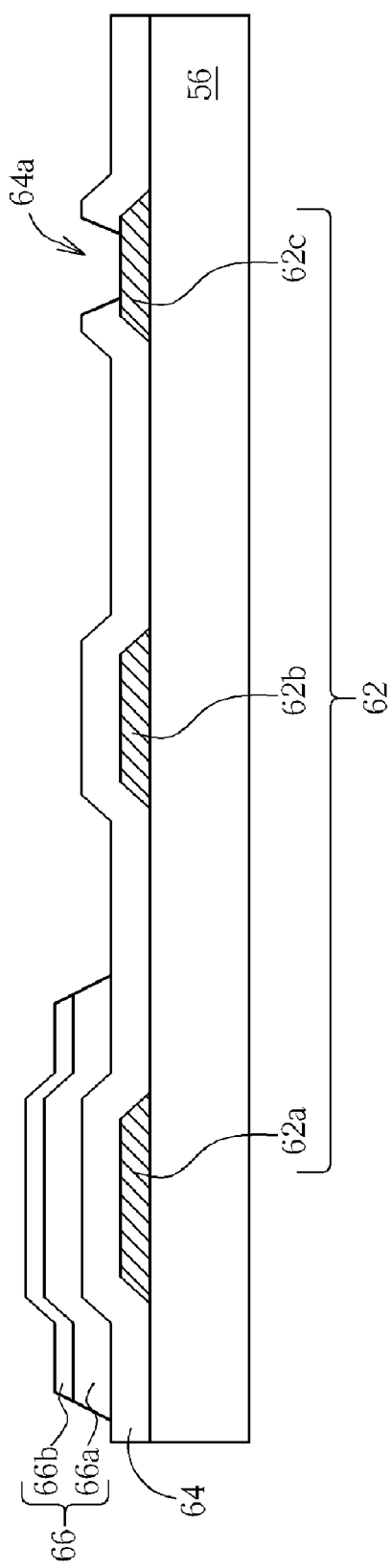

As shown in FIG. 15, an ashing process is then performed to remove a portion of the photoresist pattern 92, and the photoresist pattern 92 disposed over the gate electrode 62a is reserved. As shown in FIG. 16, the semiconductor channel 66a, the heavily doped semiconductor layer 66b and some of the first insulating layer 64 not blocked by the photoresist mask 92 are removed, and the photoresist pattern 92 is then stripped. The pixel structure is fabricated by continuing the steps illustrated in FIG. 11-12. This embodiment uses a half-tone photomask, and thus one photomask can be saved. Specifically, the step of forming the channel corresponding to the gate electrode 62a is implemented after the step of forming the first opening 64a of the first insulating layer 64 are implemented simultaneously in the same process. Also, FIG. 14 shows that the semiconductor layer 66 and the first insulating layer 64 exposed by the opening 92a of the photoresist pattern 92 are all removed to form the first opening 64a in the first insulating layer 64. However, the semiconductor channel 66a, the heavily doped semiconductor layer 66b and the first insulating layer 64 may be removed in different steps, for example by using the different etch selectivity characteristics between semiconductor material and insulating material. For example, the heavily doped semiconductor layer 66b and a portion of the semiconductor channel 66a can be etched first, and the remaining portion of the semiconductor channel 66a and the first insulating layer 64 is then removed in the step of removing the semiconductor layer 66 not covered by the reduced photoresist pattern 92. The first opening 64a may be formed by either etching off the semiconductor channel 66a, the heavily doped semiconductor layer 66b and the first insulating layer 64 in a single step, or by first etching off the semiconductor channel 66a, the heavily doped semiconductor layer and a portion of the first insulating layer 64, and then etching off the remaining first insulating layer 64.

Figure 17:
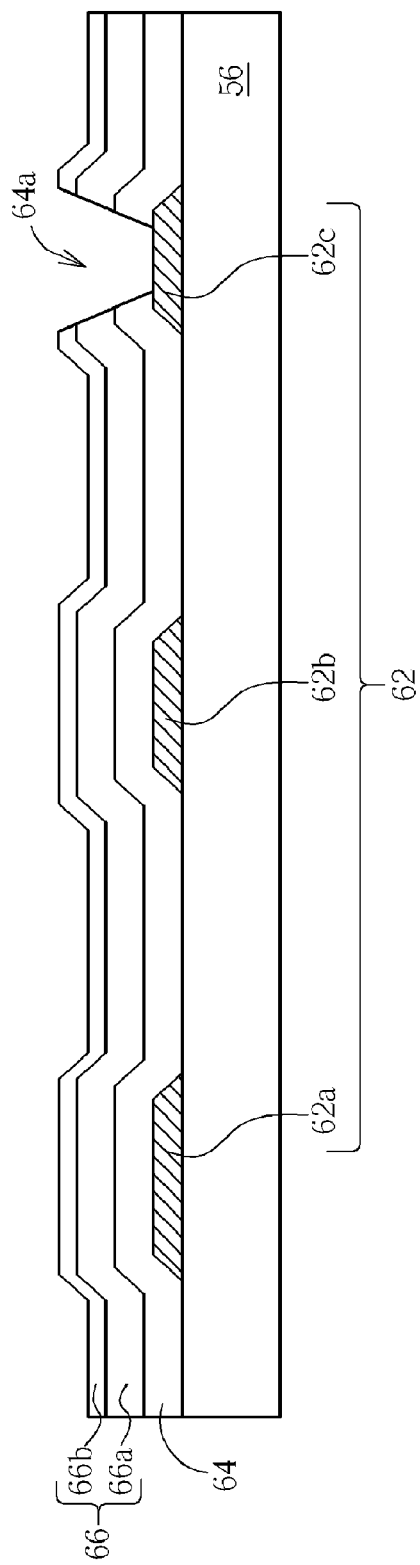
FIGS. 17-18 illustrate a method of forming a pixel structure of a display panel according to another embodiment of the present invention.
Figure 18:
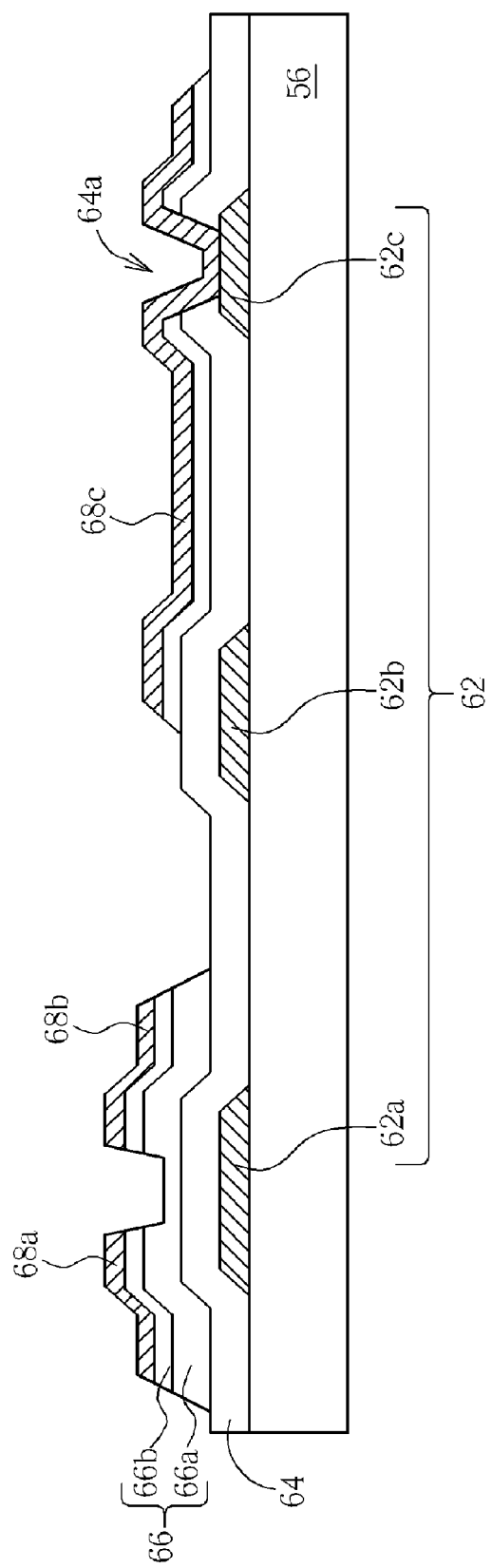

Please refer to FIGS. 17-18, in conjunction with FIG. 7 and FIGS. 11-12. FIGS. 17-18 illustrate a method of forming a pixel structure of a display panel according to another embodiment of the present invention. As shown in FIG. 17, a first conductive-patterned layer is formed on a substrate 56, and a first insulating layer 64 and a semiconductor layer 66 are consecutively formed on the first conductive-patterned layer 62 and the substrate 56, where the semiconductor layer 66 includes a semiconductor channel 66a and a heavily doped semiconductor layer 66b. Then a PEP is carried out to partially remove the semiconductor layer 66 and the first insulating layer 64 to form a first opening 64a partially exposing the first common electrode pattern 62c.

As shown in FIG. 18, another conductive layer (not shown) is formed on the semiconductor layer 66 and the first insulating layer 64, and another PEP is performed to partially remove the conductive layer to form a second conductive-patterned layer 68 and also to partially remove the semiconductor channel 66a and the heavily doped semiconductor layer 66b. The second conductive-patterned layer 68 includes a source electrode 68a and drain electrode 68b disposed on the semiconductor layer 66 and corresponding to two opposite sides of the gate electrode 62a, and a second common electrode pattern 68c. The second common electrode pattern 68c partially overlaps with the electrode pattern 62b, and is electrically connected to the first common electrode pattern 62c via the first opening 64a of the first insulating layer 64.

The pixel structure 50 may be formed by performing the steps illustrated in FIGS. 11-12. In this embodiment, the second conductive-patterned layer 68 and the semiconductor layer 66 are defined by the same photomask, and thus one photomask is reduced.

Figure 19:
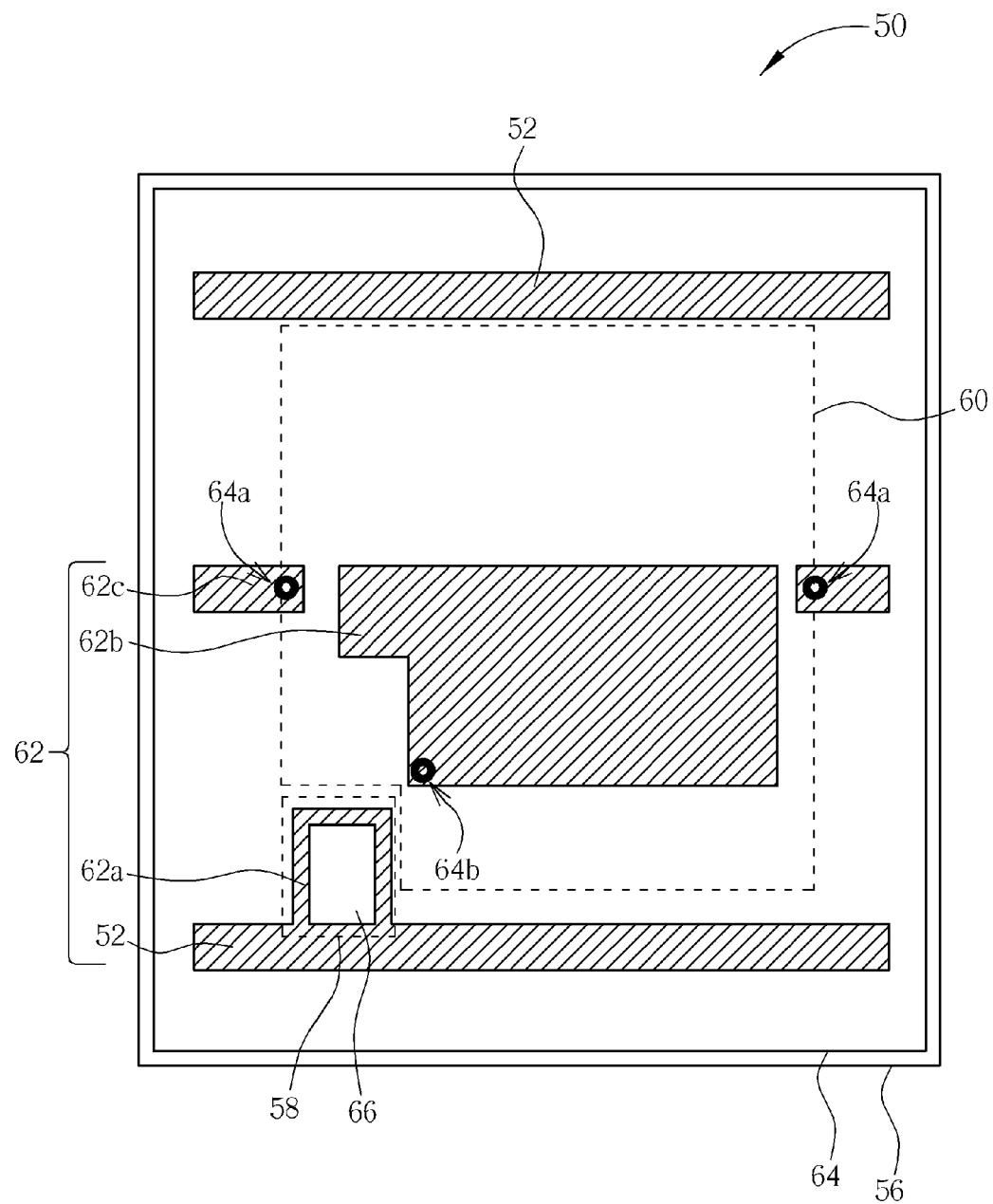
FIGS. 19-22 illustrate a method of forming a pixel structure of a display panel according to another embodiment of the present invention.

FIGS. 19-22 illustrate a method of forming a pixel structure of a display panel according to another embodiment of the present invention. In this embodiment, the electrode pattern 62b is located in the central region of the pixel region 60. Please refer to FIGS. 19-22, in conjunction with FIGS. 7-8. As shown in FIG. 19, a third PEP is performed to form two first opening 64a partially exposing the first common electrode patterns 62c disposed adjacent to two opposite sides of the electrode pattern 62b, and to form a second opening 64b partially exposing the electrode pattern 62b in the first insulating layer 64.

Figure 20:
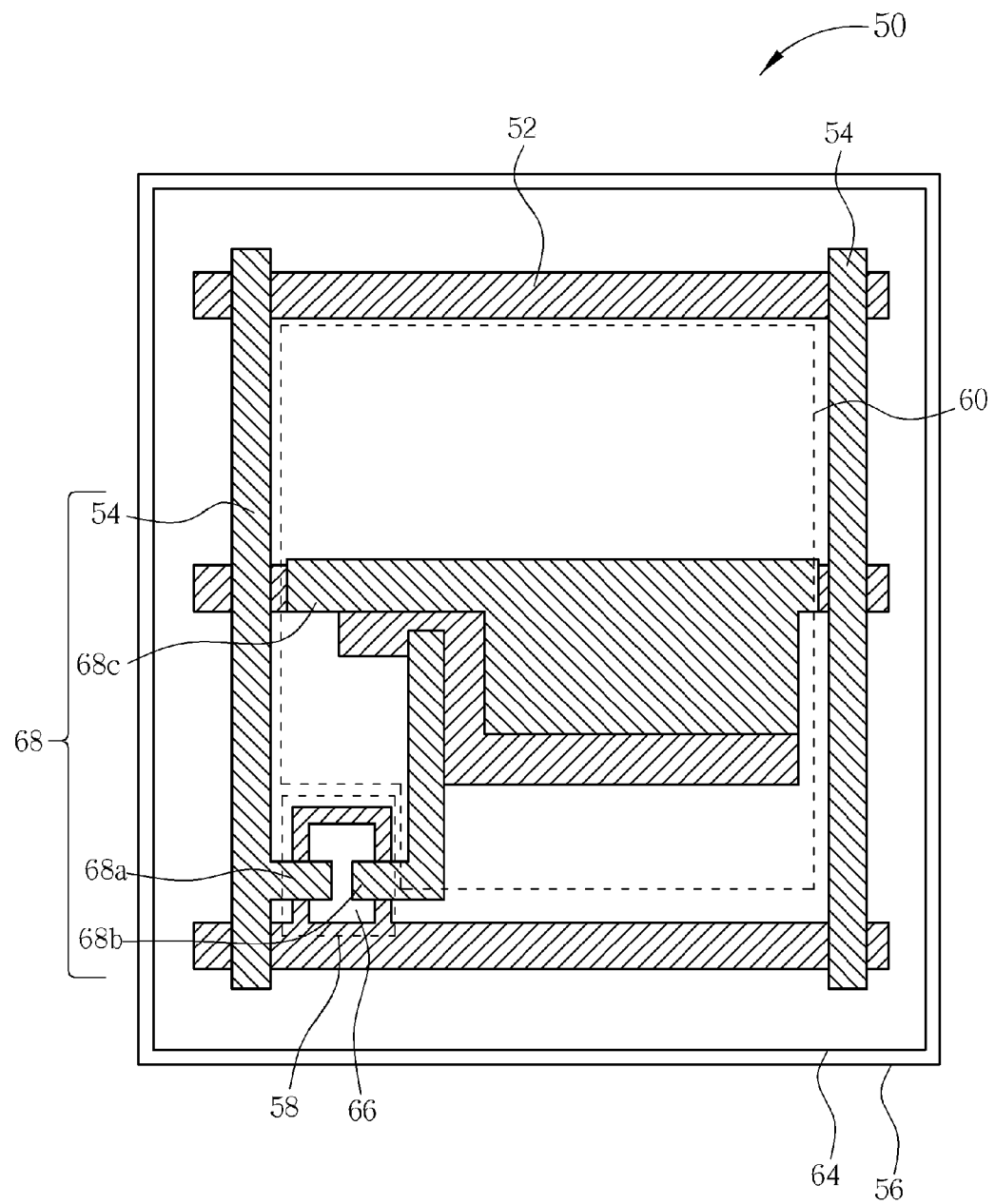

As shown in FIG. 20, another conductive layer (not shown) is formed on the semiconductor layer 66 and the first insulating layer 64, and a fourth PEP is performed to partially remove the conductive layer to form a second conductive-patterned layer 68. The second conductive-patterned layer 68 includes a source electrode 68a and drain electrode 68b disposed on the semiconductor layer 66 and corresponding to two opposite sides of the gate electrode 62a, a data line 54 is disposed on the first insulating layer 64 and is electrically connected with the source electrode 68a, and a second common electrode pattern 68c disposed on the first insulating layer 64.

The second common electrode pattern 68c partially overlaps with the electrode pattern 62b of the first conductive-patterned layer 62, and is electrically connected to the two first common electrode patterns 62c via the two first opening 64a of the first insulating layer 64. In addition, the drain electrode 68b is extended to the central region of the pixel region 60, and electrically connected to the electrode pattern 62b via the second opening 64b.

Figure 21:
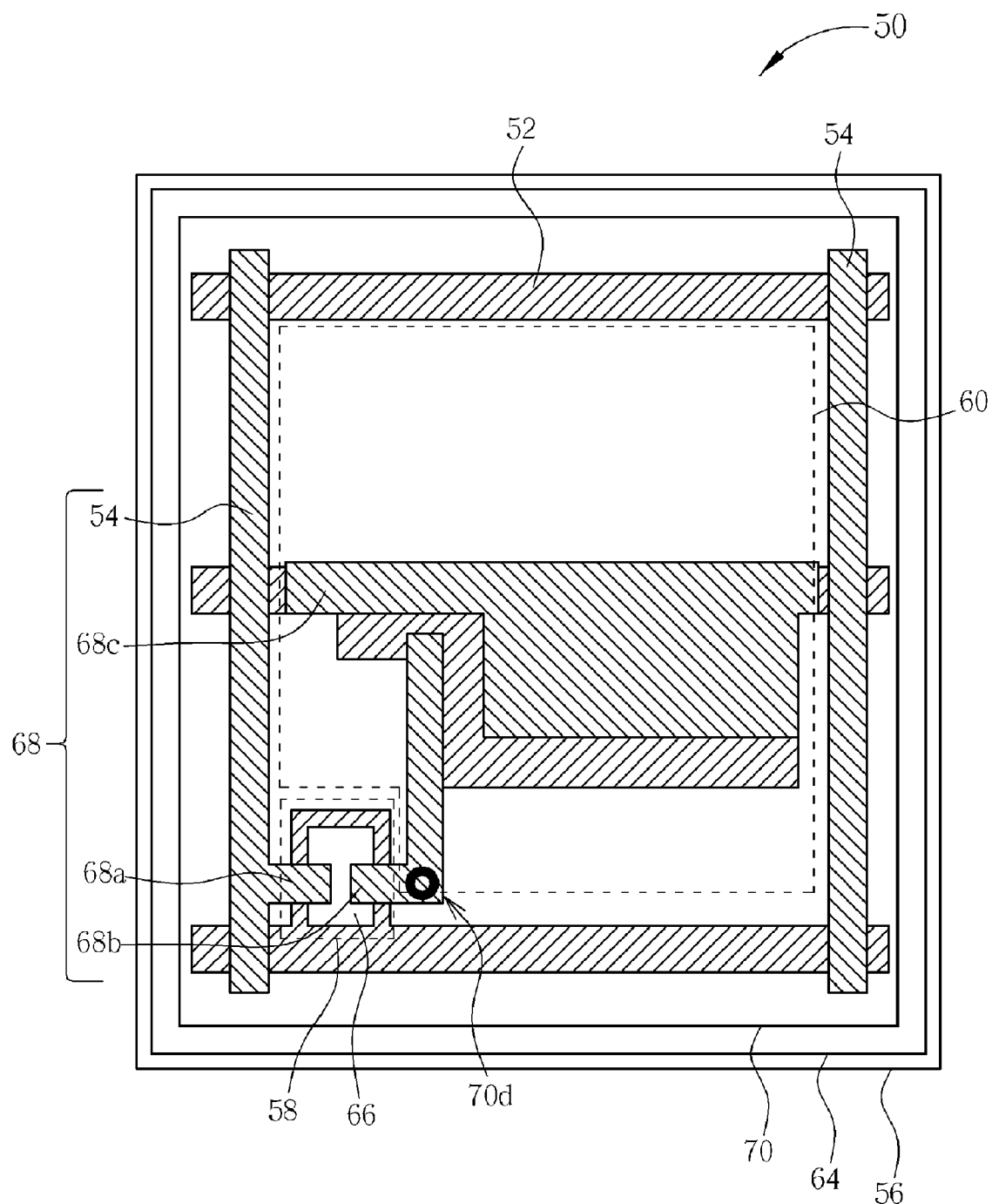

As shown in FIG. 21, a second insulating layer 70 is formed on the first insulating layer 64 and the second conductive-patterned layer 68, and a fifth PEP is performed to partially remove the second insulating layer 70 to form a fourth opening 70d in the second insulating layer 70, where the fourth opening 70d partially exposes the drain electrode 68b.

Figure 22:
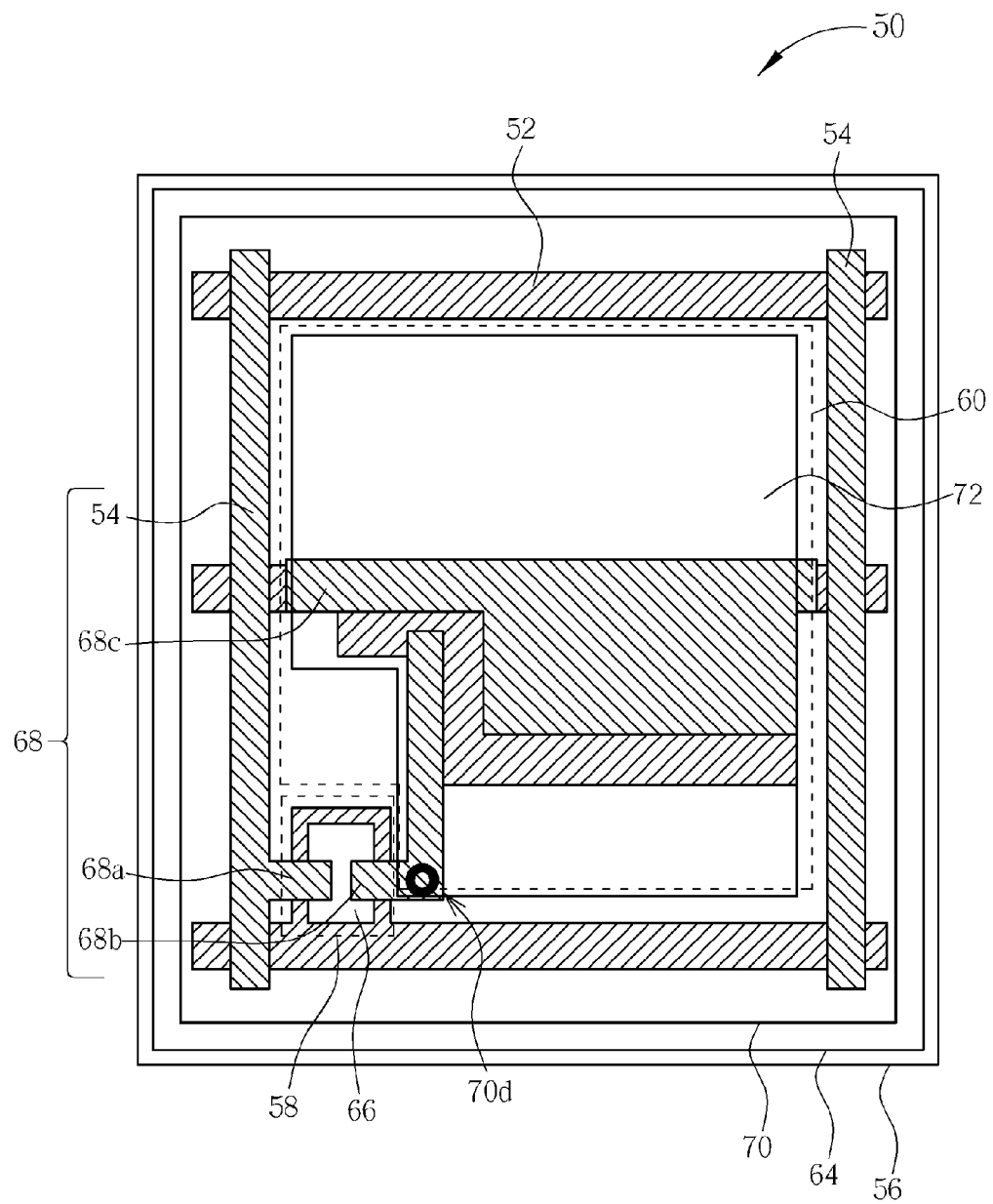

As shown in FIG. 22, a pixel electrode 72 is formed on the second insulating layer 70, filled into the fourth opening 70d to electrically connect the drain electrode 68b. The pixel electrode 72 also partially overlaps with the second common electrode pattern 68c such that the pixel electrode 72 and the second common electrode pattern 68c form a first storage capacitor Cst1, and the electrode pattern 62b and the second common electrode pattern 68c form a second storage capacitor Cst2.

In conclusion, the pixel structure of the present invention includes a first storage capacitor formed by the pixel electrode and the second common electrode pattern, and a second storage capacitor formed by the electrode pattern and the second common electrode pattern. Consequently, the storage capacitance is improved without sacrificing the aperture ratio, or the aperture ratio is improved by reducing the area of the storage capacitor when the storage capacitance is maintained.

Those skilled in the art will readily observe that numerous modifications and alterations of the device and method may be made while retaining the teachings of the invention.

What is claimed is:

1. A pixel structure of a display panel, comprising:
   a substrate;
   a first conductive-patterned layer disposed on the substrate, the first conductive-patterned layer comprising a gate electrode, an electrode pattern, and two first common electrode patterns disconnected to each other;

a first insulating layer disposed on the first conductive-patterned layer and the substrate, wherein the first insulating layer comprises at least two first openings respectively partially exposing the two first common electrode patterns;

a semiconductor layer disposed on the first insulating layer and corresponding to the gate electrode;

a second conductive-patterned layer disposed on the semiconductor layer and the first insulating layer; the second conductive-patterned layer comprising a source electrode and a drain electrode disposed on the semiconductor layer and respectively corresponding to two opposite sides of the gate electrode, a data line disposed on the first insulating layer and electrically connected to the source electrode, and a second common electrode pattern disposed on the first insulating layer, wherein the second common electrode pattern and the electrode pattern partially overlap and are electrically connected to the two first common electrode patterns respectively via the two first openings of the first insulating layer;

a second insulating layer disposed on the first insulating layer and the second conductive-patterned layer; and a pixel electrode disposed on the second insulating layer, wherein the pixel electrode, the drain electrode and the electrode pattern are electrically connected together, and the pixel electrode and the second common electrode pattern partially overlap so that the pixel electrode and the second common electrode pattern form a first storage capacitor, and the electrode pattern and the second common electrode pattern form a second storage capacitor.

2. The pixel structure of a display panel of claim 1, wherein the first insulating layer further comprises at least a second opening partially exposing the electrode pattern, and the second insulating layer further comprises at least a third opening corresponding to the second opening so that the pixel electrode is electrically connected to the electrode pattern via the third opening and the second opening, and the second insulating layer comprises a fourth opening exposing the drain electrode so that the pixel electrode is electrically connected to the drain electrode via the fourth opening.

3. The pixel structure of a display panel of claim 1, wherein the first insulating layer further comprises a second opening partially exposing the electrode pattern so that the drain electrode is electrically connected to the electrode pattern via the second opening, and the second insulating layer further comprises a third opening partially exposing the drain electrode so that the pixel electrode is electrically connected to the drain electrode via the third opening.

4. The pixel structure of a display panel of claim 1, wherein the semiconductor layer comprises a semiconductor channel, and a heavily doped semiconductor layer disposed between the semiconductor channel, and the source and the drain electrode.

5. The pixel structure of a display panel of claim 1, wherein the semiconductor layer comprises an amorphous silicon layer.

6. A method of forming a pixel structure of a display panel, comprising:

providing a substrate;

forming a first conductive-patterned layer on the substrate, wherein the first conductive-patterned layer comprises a gate electrode, an electrode pattern, and two first common electrode patterns disconnected to each other;

forming a first insulating layer on the substrate and the first conductive-patterned layer, and forming a semiconductor layer on the first insulating layer;

partially removing the semiconductor layer to form a channel corresponding to the gate electrode, and forming two first openings respectively partially exposing the two first common electrode patterns;

forming a second conductive-patterned layer on the semiconductor layer and the first insulating layer: the second conductive-patterned layer comprising a source electrode and a drain electrode disposed on the semiconductor layer and respectively corresponding to two opposite sides of the gate electrode, a data line disposed on the first insulating layer and electrically connected to the source electrode, and a second common electrode pattern disposed on the first insulating layer, wherein the second common electrode pattern partially overlaps with the electrode pattern, and electrically connected to the two first common electrode patterns respectively via the two first openings of the first insulating layer;

forming a second insulating layer on the first insulating layer and the second conductive-patterned layer; and forming a pixel electrode on the second insulating layer, wherein the pixel electrode and the second common electrode pattern partially overlap so that the pixel electrode and the second common electrode pattern form a first storage capacitor, and the electrode pattern and the second common electrode pattern form a second storage capacitor.

7. The method of claim 6, wherein the step of partially removing the semiconductor layer to form the channel corresponding to the gate electrode, and the step of forming the two first openings in the first insulating layer are implemented with two photomasks.

8. The method of claim 7, wherein the step of partially removing the semiconductor layer to form the channel corresponding to the gate electrode is implemented prior to the step of forming the two first openings in the first insulating layer.

9. The method of claim 7, wherein the step of partially removing the semiconductor layer to form the channel corresponding to the gate electrode, and the step of forming the two first openings in the first insulating layer are implemented simultaneously.

10. The method of claim 6, wherein the step of partially removing the semiconductor layer to form the channel corresponding to the gate electrode, and the step of forming the two first openings in the first insulating layer are implemented with a same halftone photomask.

11. The method of claim 6, wherein the step of partially removing the semiconductor layer to form the channel corresponding to the gate electrode, and the step of forming the second conductive-patterned layer are implemented with a same photomask.

12. The method of claim 6, further comprising forming a third opening and a fourth opening in the second insulating layer, and forming a second opening in the first insulating layer via the third opening, wherein the second opening corresponds to the third opening, the pixel electrode is electrically connected to the electrode pattern via the third opening and the second opening, the fourth opening partially exposes the drain electrode, and the pixel electrode is electrically connected to the drain electrode via the fourth opening.

13. The method of claim 6, further comprising:

forming a second opening partially exposing the electrode pattern in the first insulating layer simultaneously with the step of forming the two first openings in the first insulating layer;

electrically connecting the drain electrode to the electrode pattern via the second opening of the first insulating layer simultaneously with the step of forming the drain electrode of the second conductive-patterned layer; and forming a third opening in the second insulating layer, wherein the third opening partially exposes the drain electrode, and the pixel electrode is electrically connected to the drain electrode via the third opening.

14. The method of claim 6, wherein the step of forming the semiconductor layer comprises forming a semiconductor channel on the first insulating layer, and forming a heavily doped semiconductor layer on the semiconductor channel.

* * * * *